United States Patent
Sakaguchi

(10) Patent No.: US 11,737,269 B2
(45) Date of Patent: Aug. 22, 2023

(54) SEMICONDUCTOR STORAGE DEVICE

(71) Applicant: Kioxia Corporation, Tokyo (JP)

(72) Inventor: Takeshi Sakaguchi, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 70 days.

(21) Appl. No.: 17/189,981

(22) Filed: Mar. 2, 2021

(65) Prior Publication Data

US 2022/0093632 A1 Mar. 24, 2022

(30) Foreign Application Priority Data

Sep. 18, 2020 (JP) ................. 2020-157165

(51) Int. Cl.
*H10B 43/20* (2023.01)
*H10B 43/10* (2023.01)
*H10B 43/35* (2023.01)
*H10B 43/40* (2023.01)

(52) U.S. Cl.
CPC ............. *H10B 43/20* (2023.02); *H10B 43/10* (2023.02); *H10B 43/35* (2023.02); *H10B 43/40* (2023.02)

(58) Field of Classification Search
CPC ......... H01L 27/11578; H01L 27/11565; H01L 27/1157; H01L 27/11573; H01L 27/11575; H01L 27/11582; H10B 43/20; H10B 43/10; H10B 43/35; H10B 43/40; H10B 43/27; H10B 43/50
See application file for complete search history.

(56) References Cited

U.S. PATENT DOCUMENTS

2019/0378855 A1* 12/2019 Kim ................. H01L 27/11519
2020/0043944 A1* 2/2020 Fukuzumi ......... H01L 29/66833

FOREIGN PATENT DOCUMENTS

JP 2010-129686 A 6/2010

* cited by examiner

*Primary Examiner* — Shahed Ahmed
*Assistant Examiner* — Khatib A Rahman
(74) *Attorney, Agent, or Firm* — Foley & Lardner LLP

(57) ABSTRACT

A semiconductor storage device includes a substrate, a pad provided above the substrate, first conductor layers stacked along a direction between the substrate and the pad, a second conductor layer provided above the first conductor layers, a semiconductor layer extending along the direction in the first conductor layers and in contact with the second conductor layer, a charge storage layer provided between the semiconductor layer and the first conductor layers, a contact extending along the direction between the substrate and the pad, and a wiring layer including a first portion in contact with the second conductor layer, a second portion in contact with the contact, and a third portion connecting the first portion and the second portion. The first portion and the second portion are located at a height between a height of the second conductor layer and a height of the third portion along the direction.

17 Claims, 19 Drawing Sheets

SEMICONDUCTOR STORAGE DEVICE

CROSS-REFERENCE TO RELATED APPLICATION(S)

This application is based upon and claims the benefit of priority from Japanese Patent Application No. 2020-157165, filed Sep. 18, 2020, the entire contents of which are incorporated herein by reference.

FIELD

Embodiments described herein relate generally to a semiconductor storage device.

BACKGROUND

An NAND flash memory is known as a semiconductor storage device.

DETAILED DESCRIPTION

Figure 1:
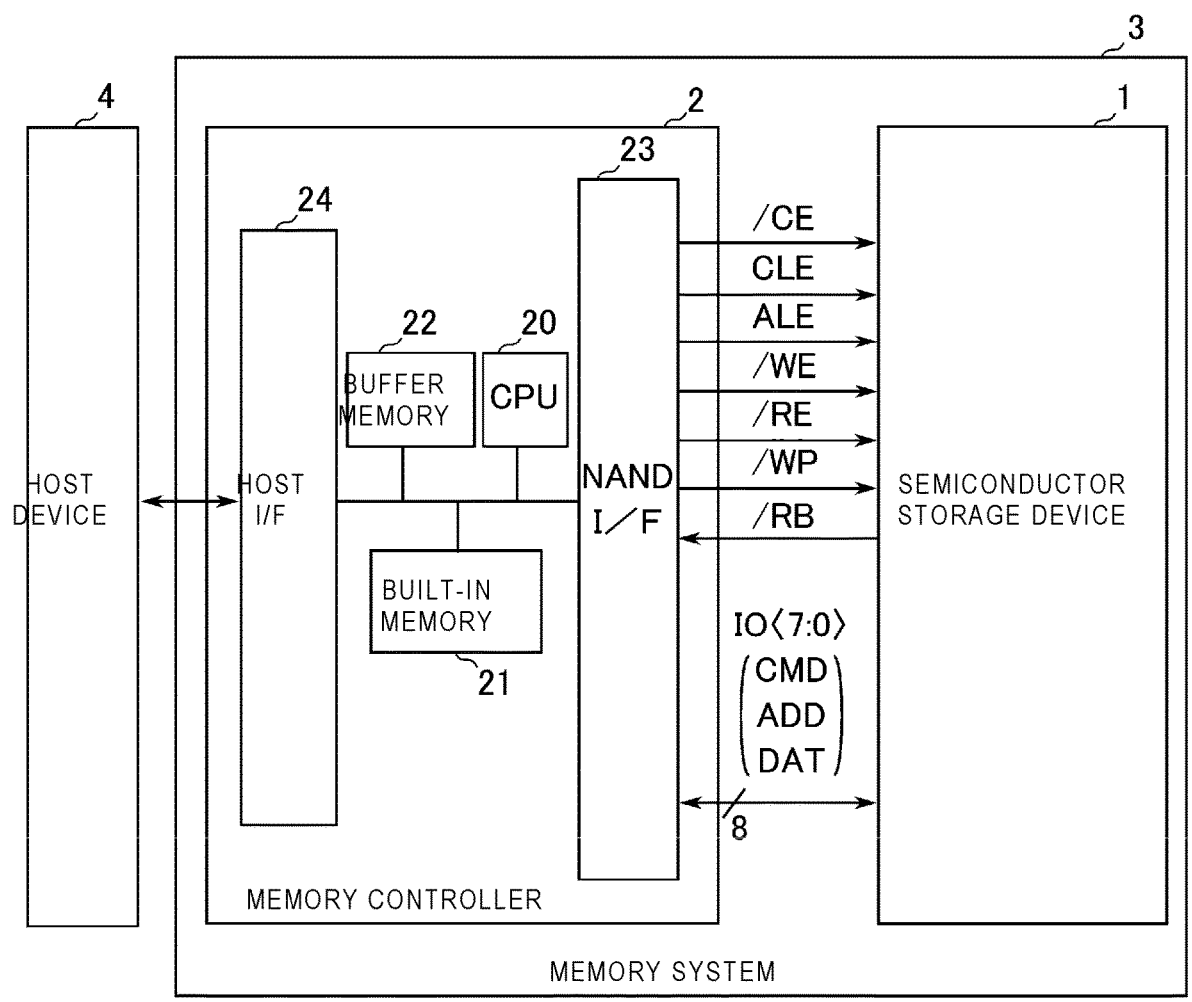
FIG. 1 is a block diagram showing an example of a configuration of a memory system including a semiconductor storage device according to some embodiments.

Embodiments provide a semiconductor storage device whose characteristics are improved while preventing an increase in manufacturing cost.

In general, according to some embodiments, a semiconductor storage device includes a substrate, a pad provided above the substrate, a plurality of first conductor layers stacked along a first direction between the substrate and the pad, a second conductor layer provided above the plurality of first conductor layers, a first semiconductor layer extending in the plurality of first conductor layers along the first direction and in contact with the second conductor layer, a charge storage layer provided between the first semiconductor layer and the plurality of first conductor layers, a first contact extending along the first direction between the substrate and the pad, and a first wiring layer. The first wiring layer may include a first portion in contact with the second conductor layer, a second portion in contact with the first contact, and a third portion connecting the first portion and the second portion. The first portion and the second portion of the first wiring layer may be located between the second conductor layer and the third portion of the first wiring layer along the first direction.

Hereinafter, embodiments will be described with reference to drawings. In the following description, components having the same function and configuration are denoted by the same reference numerals.

1. Semiconductor Storage Device

Hereinafter, a semiconductor storage device according to some embodiments will be described. Hereinafter, an NAND flash memory will be described as an example of the semiconductor storage device.

1.1 Configuration

A configuration of the semiconductor storage device according to some embodiments will be described.

1.1.1 Memory System

First, an example of a configuration of a memory system will be described with reference to FIG. 1. FIG. 1 is a block diagram showing the example of the configuration of the memory system including the semiconductor storage device according to some embodiments.

A memory system 3 communicates with, for example, an external host device 4. The memory system 3 may store data from the host device 4 and read data into the host device 4. The memory system 3 is, for example, a solid state drive (SSD) or an SD™ card.

The memory system 3 may include a semiconductor storage device 1 and a memory controller 2.

The semiconductor storage device 1 may include a plurality of memory cell transistors and store data in a nonvolatile manner. The semiconductor storage device 1 may be connected with the memory controller 2 by an NAND bus.

The NAND bus may transmit and receive signals /CE, CLE, ALE, /WE, /RE, /WP, /RB, and IO<7:0> via individual signal lines according to an NAND interface. The signal /CE may be a signal for enabling the semiconductor storage device 1. The signal CLE may notify the semiconductor storage device 1 that the signal IO<7:0> flowing into the semiconductor storage device 1 is a command when the signal CLE is at an "H (High)" level. The signal ALE may notify the semiconductor storage device 1 that the signal IO<7:0> flowing into the semiconductor storage device 1 is an address when the signal ALE is at the "H" level. The signal/WE may instruct the semiconductor storage device 1 to take in the signal IO<7:0> flowing into the semiconductor storage device 1 when the signal/WE is at an "L (Low)" level. The signal/RE may instruct the semiconductor storage device 1 to output the signal IO<7:0>. The signal/WP may instruct the semiconductor storage device 1 to prohibit data write and erase. The signal/RB may indicate whether the semiconductor storage device 1 is in a ready state (a state of receiving a command from outside) or a busy state (a state of not receiving a command from outside). The signal IO<7:0> is, for example, an 8-bit signal.

The signal IO<7:0> may be transmitted and received between the semiconductor storage device 1 and the memory controller 2, and include a command CMD, an address ADD, and data DAT. The data DAT may include write data and read data.

The memory controller 2 may receive a command from the host device 4 and control the semiconductor storage device 1 based on the received command. Specifically, the memory controller 2 may write data instructed to be written from the host device 4 into the semiconductor storage device 1, read data instructed to be read from the host device 4 from the semiconductor storage device 1 and transmit the read data to the host device 4.

Examples of the host device 4 that uses the memory system 3 described above include a digital camera, a personal computer, or the like.

1.1.2 Memory Controller

As shown in FIG. 1, the memory controller 2 may include a central processing unit (CPU) 20, a built-in memory 21, a buffer memory 22, an NAND interface circuit (NAND I/F) 23, and a host interface circuit (host I/F) 24. The memory controller 2 may be configured as, for example, a System-on-a-chip (SoC).

The CPU 20 may control overall operations of the memory controller 2. For example, in response to a data read command received from the host device 4, the CPU 20 issues a read command based on the NAND interface to the semiconductor storage device 1. This operation may be the same in a case of writing and erasing data.

The built-in memory 21 is, for example, a semiconductor memory such as a dynamic random access memory (DRAM), and is used as a work area of the CPU 20. The built-in memory 21 may store firmware for managing the semiconductor storage device 1, various management tables, or the like.

The buffer memory 22 may temporarily store read data received by the memory controller 2 from the semiconductor storage device 1, read data received from the host device 4, or the like.

The NAND interface circuit 23 may be connected with the semiconductor storage device 1 via the NAND bus and control communication with the semiconductor storage device 1. The NAND interface circuit 23 may transmit the command CMD, the address ADD, and the write data to the semiconductor storage device 1 according to an instruction of the CPU 20. Further, the NAND interface circuit 23 may receive the read data from the semiconductor storage device 1.

The host interface circuit 24 may be connected to the host device 4 via a host bus, and control communication between the memory controller 2 and the host device 4. The host interface circuit 24 may respectively transmit, for example, the instruction and the data received from the host device 4 to the CPU 20 and the buffer memory 22.

1.1.3 Semiconductor Storage Device

Figure 2:
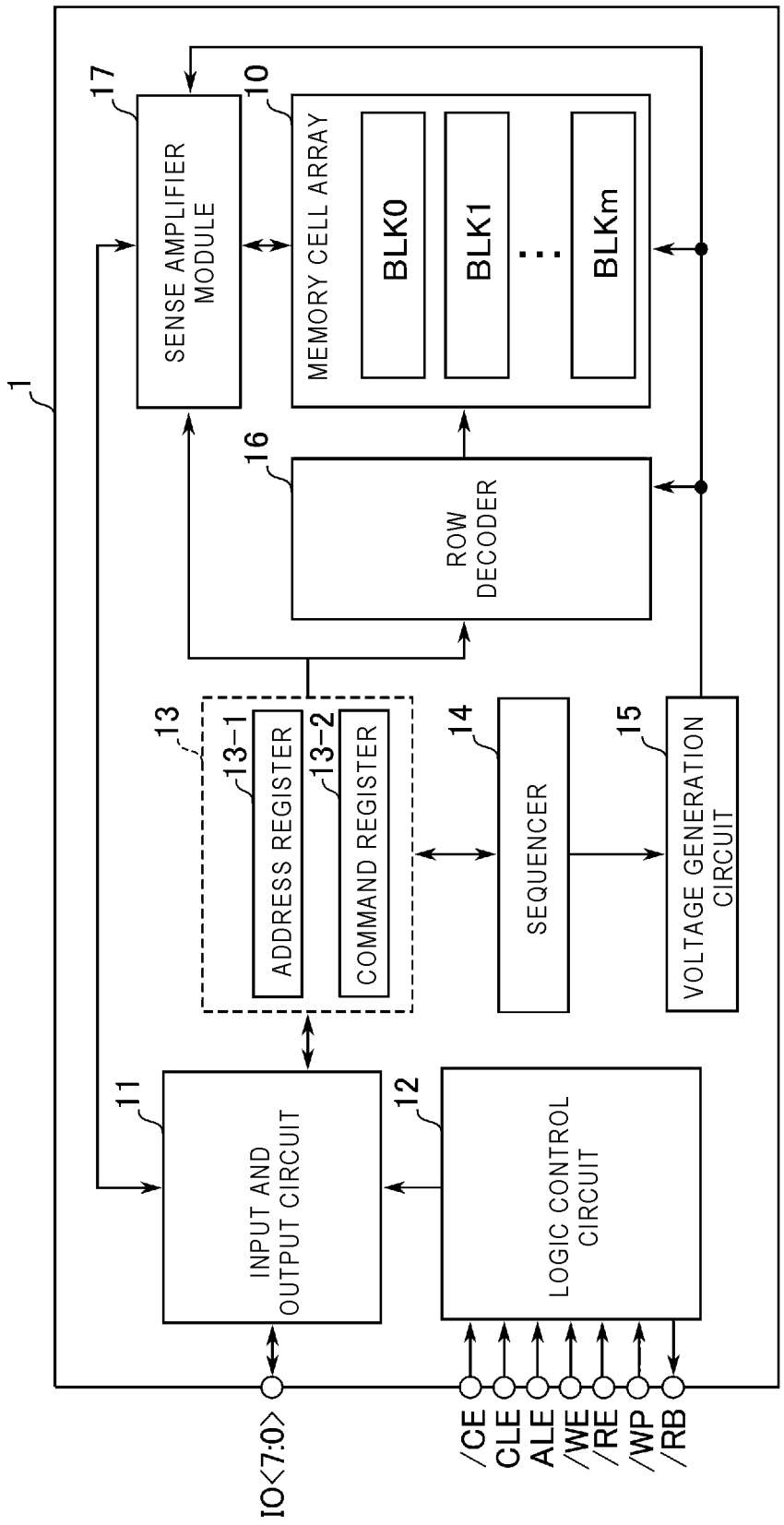
FIG. 2 is a block diagram showing an example of a configuration of the semiconductor storage device according to some embodiments.

Next, an example of a configuration of the semiconductor storage device 1 according to some embodiments will be described with reference to FIG. 2. FIG. 2 is a block diagram showing the example of the configuration of the semiconductor storage device 1 according to some embodiments.

The semiconductor storage device 1 may include a memory cell array 10, an input and output circuit 11, a logic control circuit 12, a register 13, a sequencer 14, a voltage generation circuit 15, a row decoder 16, and/or a sense amplifier module 17. The register 13 may include an address register 13-1 and a command register 13-2.

The memory cell array 10 may include a plurality of blocks BLK0 to BLKm (m is an integer equal to or larger than 1). Each block BLK may be a set including a plurality of memory cell transistors capable of storing data in a nonvolatile manner, and is used as, for example, an erase unit of data. That is, data stored in memory cell transistors provided in one block BLK may be collectively erased. A plurality of bit lines and a plurality of word lines may be provided in the memory cell array 10. Each memory cell transistor may be associated with one bit line and one word line. A detailed configuration of the memory cell array 10 will be described later.

The input and output circuit 11 may transmit the signal IO<7:0> to the memory controller 2 and receive the signal IO<7:0> from the memory controller 2. The input and output circuit 11 may respectively transmit the address ADD and the command CMD in the signal IO<7:0> to the address register 13-1 and the command register 13-2. Further, the input and output circuit 11 may transmit the data DAT to the sense amplifier module 17 and receive the data DAT from the sense amplifier module 17.

The logic control circuit 12 receives, for example, the signals /CE, CLE, ALE, /WE, /RE, and /WP from the memory controller 2, and control the input and output circuit 11 based on the received signals. The logic control circuit 12 may generate the signal/RB and transmit the signal/RB to the memory controller 2.

The register 13 may store various signals. The address register 13-1 and the command register 13-2 may respectively store the address ADD and the command CMD that are transferred from the input and output circuit 11. The address register 13-1 may transmit the address ADD to the row decoder 16 and the sense amplifier module 17, and the command register 13-2 may transmit the command CMD to the sequencer 14.

The sequencer 14 may receive the command CMD from the command register 13-2, and control the entire semiconductor storage device 1 according to a sequence based on the received command CMD.

The voltage generation circuit 15 may generate, based on an instruction from the sequencer 14, a voltage to be used in a write operation, a read operation, or the like, and supply the generated voltage to the memory cell array 10, the row decoder 16, the sense amplifier module 17, or the like.

The row decoder 16 may receive a block address in the address ADD from the address register 13-1, and select one of the blocks BLK0 to BLKm (m is an integer equal to or larger than 1) based on the block address. The row decoder 16 may select a row direction corresponding to a plurality of word lines in the selected block BLK, and apply the voltage supplied from the voltage generation circuit 15 to a selected word line.

During data read, the sense amplifier module 17 may sense a threshold voltage of a memory cell transistor to be read in the memory cell array 10 to generate read data, and transmit the generated read data to the input and output circuit 11. During data write, the sense amplifier module 17 may receive write data from the input and output circuit 11 and transmit the received write data to the memory cell array 10.

1.1.4 Memory Cell Array

Figure 3:
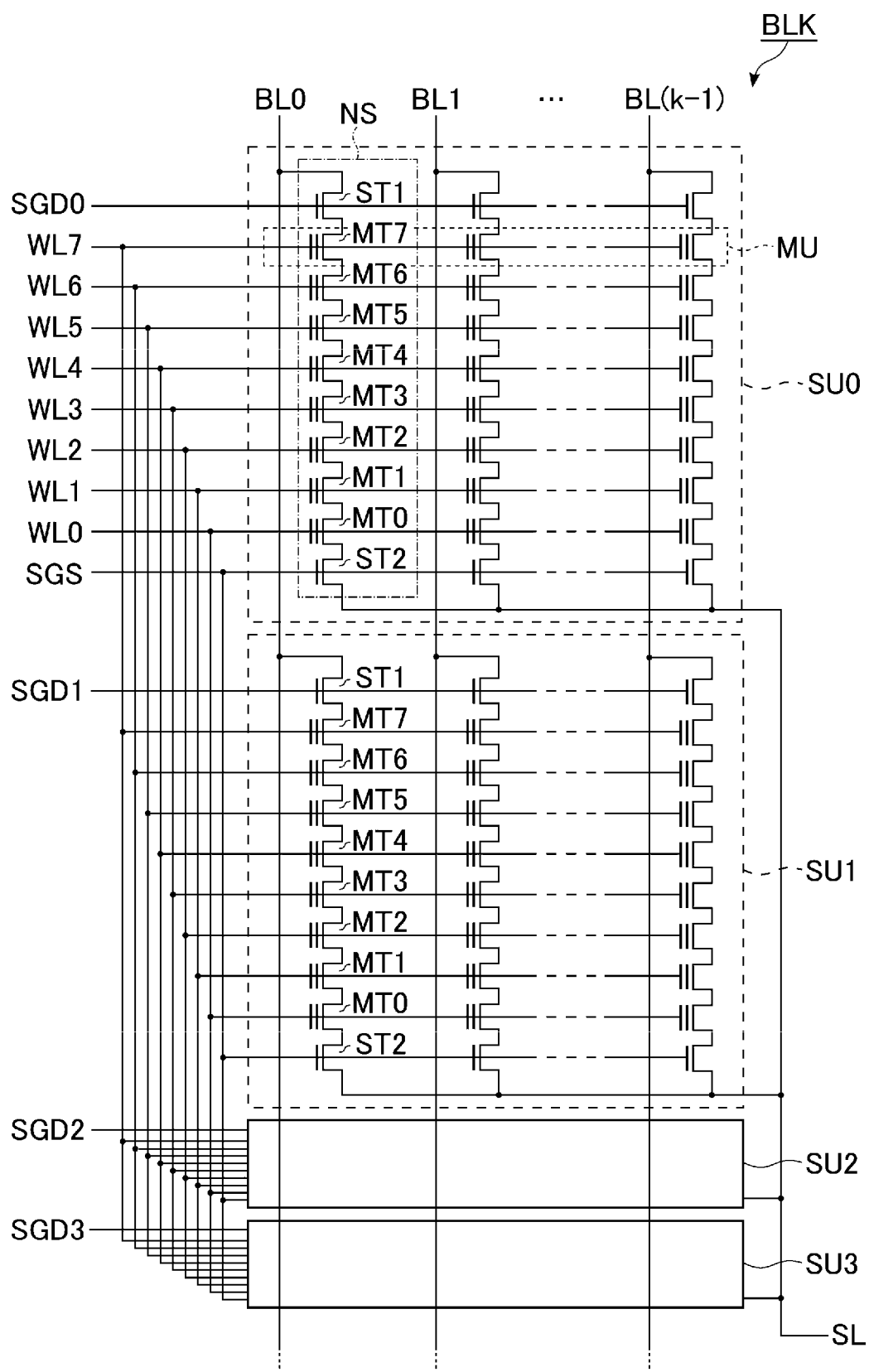
FIG. 3 is a circuit diagram showing a configuration of a memory cell array of the semiconductor storage device according to some embodiments.

Next, a configuration of the memory cell array 10 of the semiconductor storage device 1 according to some embodiments will be described with reference to FIG. 3. FIG. 3 is a circuit diagram showing an example of the configuration of the memory cell array 10 of the semiconductor storage device 1 according to some embodiments.

As shown in FIG. 3, the block BLK includes, for example, four string units SU (SU0, SU1, SU2, and SU3). Each string unit SU may include a plurality of NAND strings NS.

Each of the NAND strings NS includes, for example, eight memory cell transistors MT (MT0 to MT7), a select transistor ST1, and a select transistor ST2. The number of memory cell transistors MT provided in each of the NAND strings NS is not limited to eight, and may be 16, 32, 48, 64, 96, 128, or the like, and the number of memory cell transistors MT provided in each of the NAND strings NS is not limited. Each memory cell transistor MT may be provided with a stacked gate including a control gate unit and a charge storage unit. The memory cell transistors MT may be connected in series between the select transistor ST1 and the select transistor ST2.

In a certain block BLK, gates of the select transistors ST1 in the string units SU0 to SU3 may be respectively connected to select gate lines SGD0 to SGD3. Further, gates of the select transistors ST2 in all of the string units SU in the block BLK may be commonly connected to a select gate line SGS. Similar to the select gate line SGD, for the select gate line SGS, the gates of the select transistors ST2 in the string units SU0 to SU3 may be respectively connected to select gate lines SGS0 to SGS3 (not shown). Control gates of the memory cell transistors MT0 to MT7 in one block BLK may be respectively connected to word lines WL0 to WL7. That is, the word lines WL may be commonly connected to all of the string units SU in one block BLK, and the select gate line SGS may be commonly connected to all of the string units SU in one block BLK. On the other hand, the select gate line SGD may be connected to only one of the string units SU in one block BLK.

Further, the other ends of the select transistors ST1 in the NAND strings NS in the same row among the NAND strings NS arranged in a matrix configuration in the memory cell array 10 may be each connected to one of k (k is an integer equal to or larger than 2) bit lines BL (BL0 to BL(k–1)). Further, the bit line BL may be commonly connected to the NAND strings NS in the same column across the plurality of blocks BLK.

Further, the other end of the select transistor ST2 may be connected to a source line SL. The source line SL may be commonly connected to the plurality of NAND strings NS across the plurality of blocks BLK.

As described above, for example, data erasing is collectively performed for the memory cell transistors MT in one block BLK. On the other hand, the data reading and the data writing can be collectively performed for the plurality of memory cell transistors MT in a certain string unit SU of a certain block BLK that are commonly connected to a certain word line WL. In this manner, a set including the memory cell transistors MT in one string unit SU that share the word line WL is referred to as a memory cell unit MU. That is, the memory cell unit MU may be a set including the memory cell transistors MT in which a write operation or a read operation can be collectively performed.

A unit of a data string of one-bit data stored in each of the plurality of memory cell transistors MT in the memory cell unit MU is defined as a "page". For example, when two-bit data can be stored in the memory cell transistor MT, two pages of data are stored in the memory cell unit MU. The memory cell transistor MT is not limited to be capable of storing two-bit data, and may be capable of storing three-bit or more data.

1.1.5 Structure of Memory Cell Array

Figure 4:
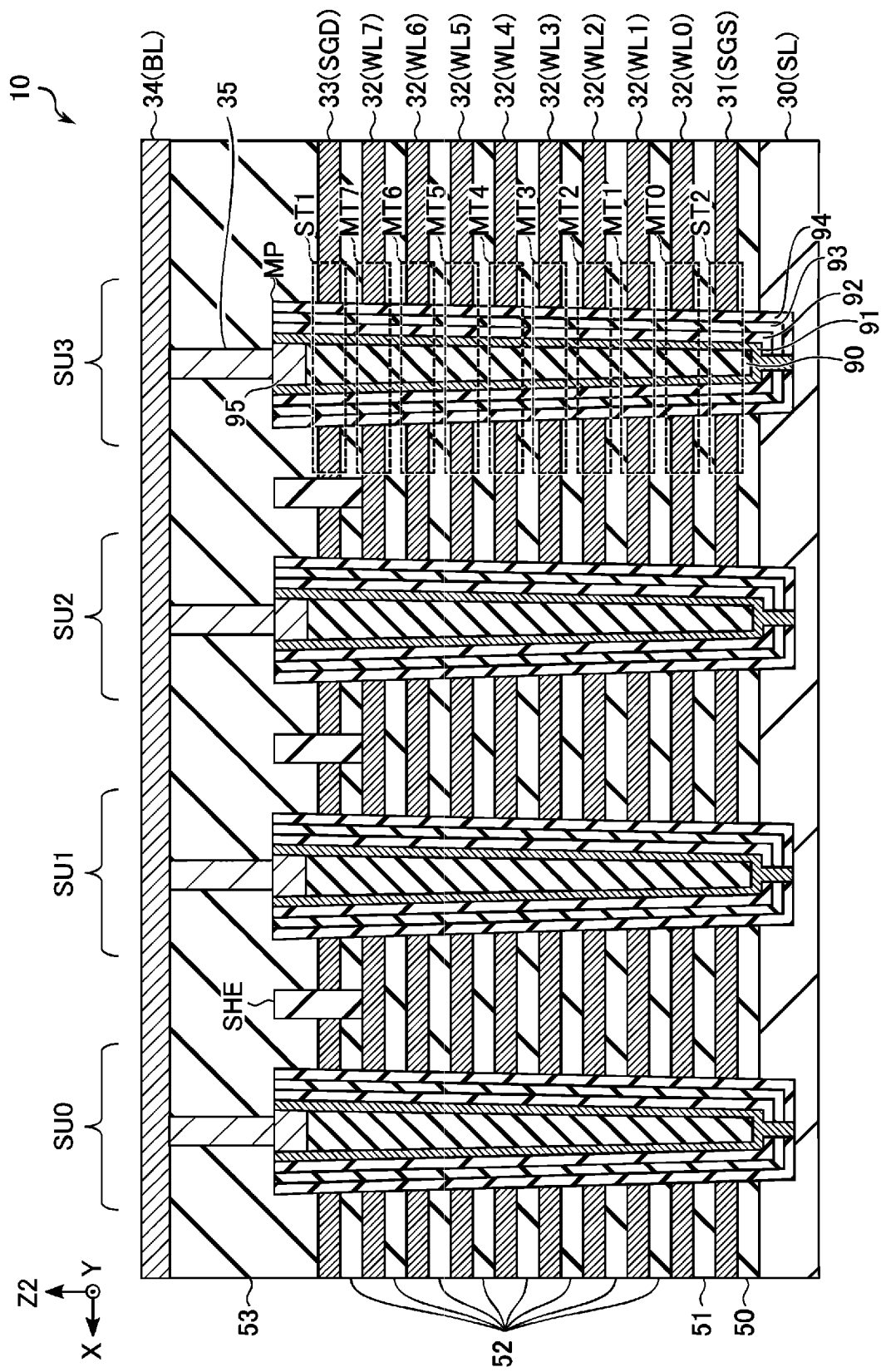
FIG. 4 is a cross-sectional view of the memory cell array of the semiconductor storage device according to some embodiments.

Next, a structure of the memory cell array 10 will be described with reference to FIG. 4. FIG. 4 is an example of a cross-sectional structure of the memory cell array 10 of the semiconductor storage device 1 according to some embodiments.

In the drawings referred to below, an X direction corresponds to an extending direction of the bit line BL, and a Y direction corresponds to an extending direction of the word line WL. A Z1 direction corresponds to a direction from a semiconductor substrate to an electrode pad of the semiconductor storage device 1, and a Z2 direction corresponds to a direction from the electrode pad to the semiconductor substrate of the semiconductor storage device 1. When neither the Z1 direction nor the Z2 direction is limited, the direction is expressed as a Z direction. In the following description, when a component has two surfaces (or end portions) extending in an XY plane and the two surfaces (or end portions) are adjacent along the Z direction, one surface on an electrode pad side of the two surfaces (or end portions) is set as a first surface (first end), and one surface on a semiconductor substrate side is set as a second surface (second end).

The memory cell array 10 may be provided between the electrode pad and the semiconductor substrate of the semiconductor storage device 1 in the Z direction, and include conductor layers 30 to 35 and a plurality of memory pillars MP (only a part of which is shown in FIG. 4).

The conductor layer 30 may be formed into, for example, a plate shape extending along the XY plane. The conductor layer 30 may be used as the source line SL. The conductor layer 30 may be formed of a conductive material, and an N-type semiconductor into which impurities are added, a metal material, or the like may be used as the conductor layer 30. Further, the conductor layer 30 may have, for example, a stacked structure of a semiconductor and a metal.

An insulator layer 50 may be stacked on a second surface of the conductor layer 30. The conductor layer 31 may be stacked on a second surface of the insulator layer 50. The conductor layer 31 is formed into, for example, a plate shape extending along the XY plane. The conductor layer 31 may be used as the select gate line SGS. The conductor layer 31 contains, for example, tungsten.

An insulator layer 51 may be stacked on a second surface of the conductor layer 31. Eight conductor layers 32 and eight insulator layers 52 may be stacked on a second surface of the insulator layer 51 in an order of the conductor layer 32, the insulator layer 52, . . . , the conductor layer 32, and the insulator layer 52 in the Z2 direction. The conductor layer 32 is formed into, for example, a plate shape extending along the XY plane. The eight conductor layers 32 may be respectively used as the word lines WL0 to WL7 in order from the conductor layer 31 side along the Z2 direction. The conductor layer 32 contains, for example, tungsten.

The conductor layer 33 may be stacked on a second surface of the last insulator layer 52 on the semiconductor substrate side. The conductor layer 33 is formed into, for example, a plate shape extending along the XY plane. The conductor layer 33 may be used as the select gate line SGD. The conductor layer 33 contains, for example, tungsten. The conductor layer 33 may be electrically cut off for each string unit SU by, for example, a slit SHE.

An insulator layer 53 may be stacked on a second surface of the conductor layer 33. The conductor layer 34 may be stacked on a second surface of the insulator layer 53. The conductor layer 34 may extend along the X direction and functions as the bit line BL.

On the electrode pad side of the conductor layer 34, the plurality of memory pillars MP may extend along the Z2 direction, and penetrate the conductor layers 31 to 33.

Each of the memory pillars MP includes, for example, a core member 90, a semiconductor film (or a semiconductor layer) 91, a tunnel insulating film 92, a charge storage film (or charge storage layer) 93, a block insulating film 94, and a semiconductor portion 95.

The core member 90 may extend along the Z2 direction. A second end of the core member 90 may be located on the semiconductor substrate side of the conductor layer 33, and a first end of the core member 90 may be located on the electrode pad side of the conductor layer 31. The core member 90 contains, for example, silicon oxide.

The semiconductor film 91 may cover side surfaces of the core member 90. A second end of the semiconductor film 91 may be located on the semiconductor substrate side of the second end of the core member 90. A first end of the semiconductor film 91 may cover the first end of the core member 90, and may be in contact with the conductor layer 30. The semiconductor film 91 contains, for example, polysilicon.

The tunnel insulating film 92 may cover side surfaces of the semiconductor film 91. The tunnel insulating film 92 contains, for example, silicon oxide.

The charge storage film 93 may cover side surfaces of the tunnel insulating film 92. The charge storage film 93 contains, for example, an insulator (for example, silicon nitride) having a trap level.

The block insulating film 94 may cover side surfaces of the charge storage film 93. The block insulating film 94 contains, for example, silicon oxide.

The semiconductor portion 95 may cover the second end of the core member 90. A side surface of the semiconductor portion 95 may cover an inner wall portion of the semiconductor film 91 located on the semiconductor substrate side on the second end of the core member 90. A second surface of the semiconductor portion 95 may be in contact with the conductor layer 35. The conductor layer 35 may be connected to the conductor layer 34, and the memory pillars MP and the conductor layer 34 may be electrically connected.

In the structure of the memory pillar MP described above, a portion where the memory pillar MP and the conductor layer 31 may intersect each other functions as the select transistor ST2. Further, a portion where the memory pillar MP and the conductor layer 32 intersect each other may function as the memory cell transistor MT. Further, a portion where the memory pillar MP and the conductor layer 33 intersect each other may function as the select transistor ST1. Further, the semiconductor film 91 may function as a channel for each of the memory cell transistors MT0 to MT7, the select transistor ST1, and the select transistor ST2.

Further, the charge storage film 93 may function as a charge storage unit of the memory cell transistor MT.

Although an example in which the charge storage film 93 is provided as a continuous film in the memory pillar MP was shown in the above description, the present disclosure is not limited thereto. For example, the charge storage film 93 may be individually separated and provided for each of the plurality of memory cell transistors MT in an NAND string NS. In this case, the individually separated and provided charge storage film 93 may contain polysilicon or a metal including at least one selected from titanium, tungsten, and ruthenium.

1.1.6 Structure of Semiconductor Storage Device

Hereinafter, an example of a structure of the semiconductor storage device 1 according to some embodiments will be described.

1.1.6.1 Planar Layout of Semiconductor Storage Device

Figure 5:
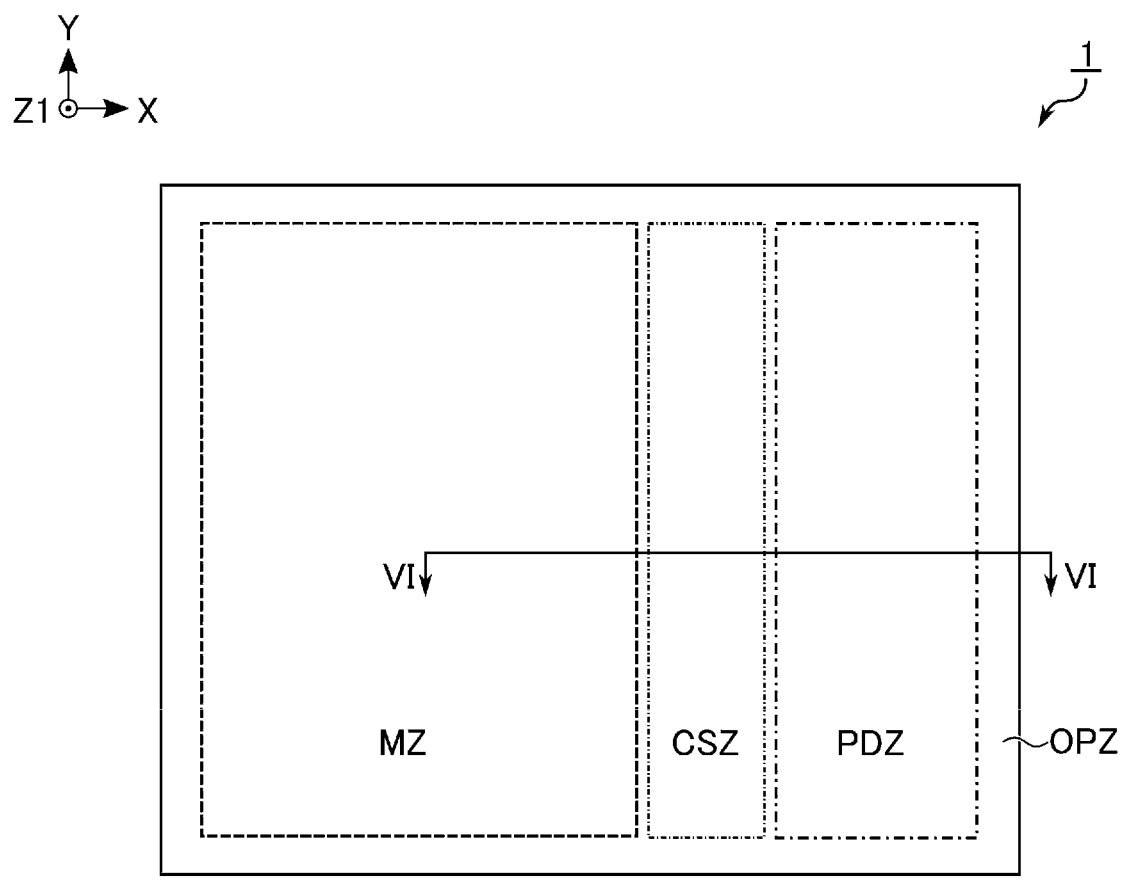
FIG. 5 is a planar layout showing an example of the semiconductor storage device according to some embodiments.

A planar layout of the semiconductor storage device 1 according to some embodiments will be described with reference to FIG. 5. FIG. 5 is an example of the planar layout of the semiconductor storage device 1 according to some embodiments.

As shown in FIG. 5, the semiconductor storage device 1 has, for example, a rectangular shape including a memory region MZ, a contact region CSZ, a pad region PDZ, and an outer peripheral region OPZ in an XY plan view. The memory region MZ, the contact region CS, and the pad region PDZ may each have a rectangular shape, and are arranged in this order along the X direction. The outer peripheral region OPZ may surround the memory region MZ, the contact region CS, and the pad region PDZ in the XY plane.

The memory region MZ may be a region including the memory cell array 10.

The contact region CSZ may be a region in which a connection portion that connects the memory cell array 10 and various circuits such as the sense amplifier module 17 is provided.

The pad region PDZ may be a region in which an electrode pad for connecting an external device such as the memory controller 2 and the semiconductor storage device 1 is provided.

The outer peripheral region OPZ may be a region including a chip end portion. The outer peripheral region OPZ is, for example, a region in which an alignment pattern used when a wiring layer is formed in a manufacturing process of the semiconductor storage device 1 and a scribe line are provided.

1.1.6.2 Cross-Sectional Structure of Semiconductor Storage Device

Figure 6:
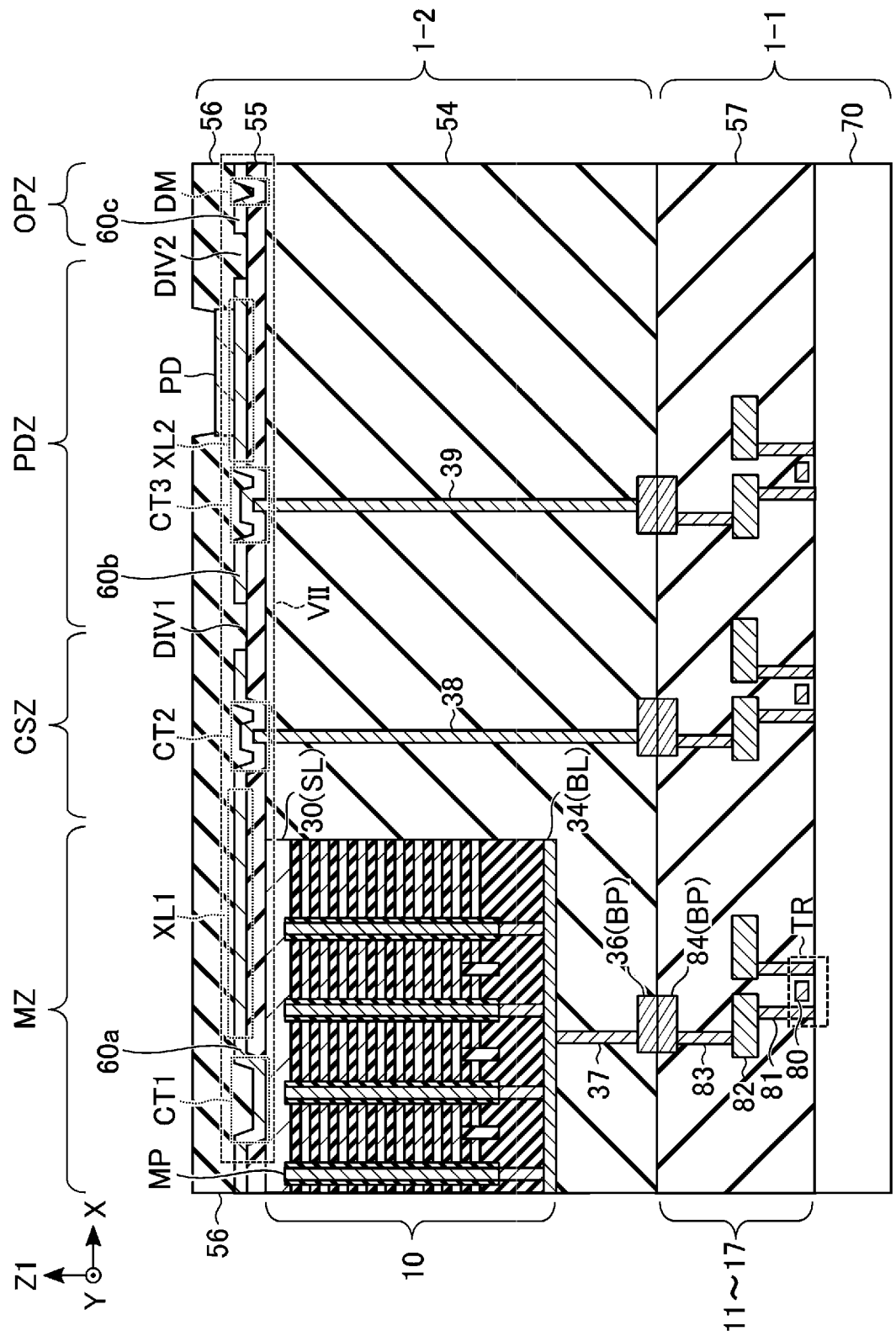
FIG. 6 is a cross-sectional view of the semiconductor storage device along a line VI-VI of FIG. 5.

A cross-sectional structure of the semiconductor storage device 1 according to some embodiments will be described with reference to FIG. 6. FIG. 6 is an example of the cross-sectional structure of the semiconductor storage device 1 along a line VI-VI of FIG. 5.

As shown in FIG. 6, the semiconductor storage device 1 may have a configuration in which a circuit chip 1-1 and a memory chip 1-2 are bonded together. The circuit chip 1-1 may include a semiconductor substrate 70 and various circuits 11 to 17 formed on the semiconductor substrate 70. The memory chip 1-2 may include the memory cell array 10 and an electrode pad PD.

First, a cross-sectional structure of the circuit chip 1-1 will be described.

The various circuits 11 to 17 may be formed in the regions excluding the outer peripheral region OPZ. In FIG. 6, as an example, several transistors TR are shown as an example of configurations in the various circuits 11 to 17.

The circuit chip 1-1 may include the semiconductor substrate 70, gate electrodes 80 provided on a first surface of the semiconductor substrate 70, and conductor layers 81 to 84.

An insulator layer 57 may be provided on the first surface of the semiconductor substrate 70. A plurality of gate electrodes 80 and a plurality of conductor layers 81 to 84 may be provided in the insulator layer 57. The insulator layer 57 is, for example, silicon oxide.

A source and a drain (not shown) may be formed at an interval in the semiconductor substrate 70. The gate electrodes 80 may be provided, via a gate insulating film (not shown), in a region between the source and the drain on the first surface of the semiconductor substrate 70. With such a configuration, a transistor TR having a metal-oxide-semiconductor field effect transistor (MOSFET) structure may be formed on the first surface side of the semiconductor substrate 70.

For example, a certain one of the plurality of conductor layers 81 functioning as columnar contacts is provided on the source and drain of the transistor TR. A certain one of the plurality of conductor layers 82 may be provided on a first surface of the conductor layer 81. For example, a certain one of the plurality of conductor layers 83 functioning as columnar contacts may be provided on a first surface of the conductor layer 82. A certain one of the plurality of conductor layers 84 may be provided on a first surface of the conductor layer 83.

The plurality of conductor layers 84 may be provided in, for example, the memory region MZ, the contact region CSZ, and the pad region PDZ, and each may function as a connection pad BP (e.g., bonding metal), on a first surface of the circuit chip 1-1, for electrically connecting the circuit chip 1-1 and the memory chip 1-2.

Next, a cross-sectional structure of the memory chip 1-2 will be described.

The memory chip 1-2 may include conductor layers 36, 37, 38, and 39, the memory cell array 10, wiring layers 60a, 60b, and 60c, and the electrode pad PD.

In the memory chip 1-2, an insulator layer 54 may be provided on the first surface of the circuit chip 1-1. The insulator layer 54 contains, for example, silicon oxide. The conductor layers 36 to 39 and the memory cell array 10 may be provided inside the insulator layer 54.

In a second surface of the memory chip 1-2, a certain one of a plurality of conductor layers 36 functioning as the connection pads BP may be provided on a first surface of each of the plurality of conductor layers 84 of the circuit chip 1-1. That is, the plurality of conductor layers 36 may correspond to the plurality of conductor layers 84, and may be provided in the memory region MZ, the contact region CSZ, and the pad region PDZ. Accordingly, the circuit chip 1-1 and the memory chip 1-2 may be electrically connected by the plurality of conductor layers 36 and the plurality of conductor layers 84.

The memory cell array 10 may be provided on the electrode pad PD side of the conductor layer 36 in the memory region MZ. The memory cell array 10 may be provided such that the conductor layer 34 is disposed on the semiconductor substrate 70 side and the conductor layer 30 is disposed on the electrode pad PD side. A second surface of the conductor layer 34 may be connected to a first surface of the conductor layer 36 in the memory region MZ via, for example, the conductor layer 37 that functions as a columnar contact. A first surface of the conductor layer 30 may be located at the same height as a first surface of the insulator layer 54.

The conductor layer 38 that functions as a contact may be provided on the first surface of the conductor layer 36 in the contact region CSZ. A first end of the conductor layer 38 may be located on the electrode pad PD side of the first surface of the conductor layer 30 and the first surface of the insulator layer 54.

The conductor layer 39 that functions as a contact may be provided on the first surface of the conductor layer 36 in the pad region PDZ. A first end of the conductor layer 39 may be located on the electrode pad PD side of the first surface of the conductor layer 30 and the first surface of the insulator layer 54.

The wiring layers 60a, 60b, and 60c may be provided on the electrode pad PD side of the conductor layer 30 and the insulator layer 54, and contain, for example, aluminum. The wiring layer 60a may be provided across the memory region MZ and the contact region CSZ. The wiring layer 60b may be provided in the pad region PDZ. The wiring layer 60c may be provided in the outer peripheral region OPZ. The wiring layers 60a and 60b may be separated in a region (separation portion DIV1) between the contact region CSZ and the pad region PDZ. The wiring layers 60b and 60c may be separated in a region (separation portion DIV2) between the pad region PDZ and the outer peripheral region OPZ.

The wiring layer 60a may include portions CT1, CT2, and XL1 that extend along the X direction and are adjacent with each other along the X direction. The portion CT1 may be in contact with at least a part of the first surface of the conductor layer 30. The portion CT2 may be in contact with a first surface of the conductor layer 38 (e.g., an upper surface of the conductor layer 38 in FIG. 6) and a region of the first surface of the insulator layer 54, which surrounds the first end of the conductor layer 38. The portion XL1 may connect the portions CT1 and CT2 at a position where the portion XL1 is not in contact with the first surface of the conductor layer 30 and the first surface of the insulator layer 54. That is, the wiring layer 60a may electrically connect the conductor layer 30 and the conductor layer 38.

The wiring layer 60b may include portions CT3 and XL2 that extend along the X direction and are adjacent with each other along the X direction. The portion CT3 may be in contact with a first surface of the conductor layer 39 and a region of the first surface of the insulator layer 54, which surrounds the first end of the conductor layer 39. The portion XL2 may connect the portion CT3 and the electrode pad PD at a position where the portion XL2 is not in contact with the first surface of the insulator layer 54. That is, the wiring layer 60b may electrically connect the electrode pad PD and the conductor layer 39.

The wiring layer 60c may include a portion DM that is in contact with the first surface of the insulator layer 54. A part of the first surface of the insulator layer 54 with which the portion DM contacts may be used as an alignment pattern in a manufacturing process of the semiconductor storage device 1 to be described later.

The electrode pad PD may be provided on a first surface of the portion XL2 of the wiring layer 60b. The electrode pad PD can be connected to a mounting substrate, an external device, or the like by, for example, a bonding wire, a solder ball, a metal bump, or the like. The electrode pad PD contains, for example, copper.

An insulator layer 55 may be provided up to a height of a second surface of the portions XL1 and XL2 in a region, on the first surface of each of the insulator layer 54 and the conductor layer 30, where the insulator layer 55 is not in contact with the wiring layers 60a to 60c. The insulator layer 55 contains, for example, silicon oxide.

An insulator layer 56 may be provided on a first surface of each of the wiring layer 60a, the wiring layer 60c, and the insulator layer 55, and on a region of a first surface of the wiring layer 60b excluding a region where the electrode pad PD is provided. The insulator layer 56 may be used as a passivation film and contains, for example, silicon oxide.

1.1.6.3 Structures of Wiring Layers and Surroundings

Figure 7:
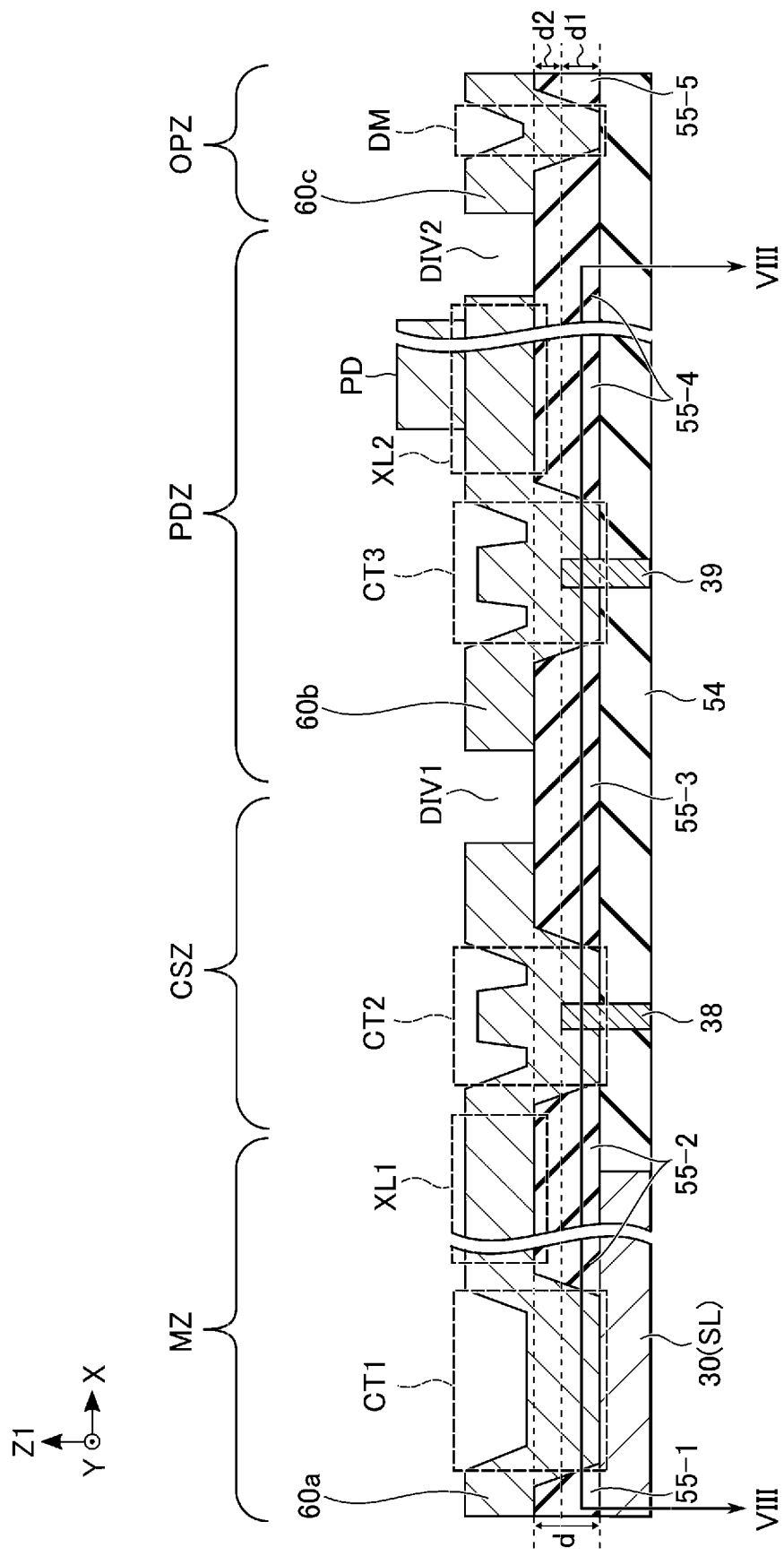
FIG. 7 is a cross-sectional view of the semiconductor storage device corresponding to a region VII of FIG. 6.

Next, structures of the wiring layers 60a to 60c, the conductor layers 38 and 39, and the insulator layer 55 will be described with reference to FIG. 7. FIG. 7 is an enlarged view of a region VII of FIG. 6. In FIG. 7, a configuration of the insulator layer 56 is omitted for the sake of clarity.

As shown in FIG. 7, the insulator layer 55 includes, for example, a plurality of portions 55-1, 55-2, 55-3, 55-4, and 55-5. One end of the portion 55-1 in the X direction and one end of the portion 55-2 in the X direction may sandwich the portion CT1 in the X direction. The other end of the portion 55-2 in the X direction and one end of the portion 55-3 in the X direction may sandwich the portion CT2 in the X direction. The other end of the portion 55-3 in the X direction and one end of the portion 55-4 in the X direction may sandwich the portion CT3 in the X direction. The other end of the portion 55-4 in the X direction and one end of the portion 55-5 in the X direction may sandwich the portion DM in the X direction.

The plurality of portions 55-1 to 55-5 may have the same thickness d. A second surface of each of the plurality of portions 55-1 to 55-5 may be located at the same height as the first surface of each of the conductor layer 30 and the insulator layer 54 (that is, the second surfaces may be in contact with the first surface of the conductor layer 30 and the first surface of the insulator layer 54). Accordingly, first surfaces of the plurality of portions 55-1 to 55-5 may be located at the same height. Therefore, the second surfaces of the portions (including the portions XL1 and XL2) of the wiring layers 60a, 60b, and 60c that are provided on the first surfaces of the plurality of portions 55-1 to 55-5 may be located at the same height.

The first surface of the conductor layer 38 may be located at a position higher than the second surface of each of the portions 55-1 to 55-5 by an interval d1, and lower than the first surface of each of the portions 55-1 to 55-5 by an interval d2 (d2=d−d1). The first surface of the conductor layer 39 is located, for example, at the same height as the first surface of the conductor layer 38.

Figure 8:
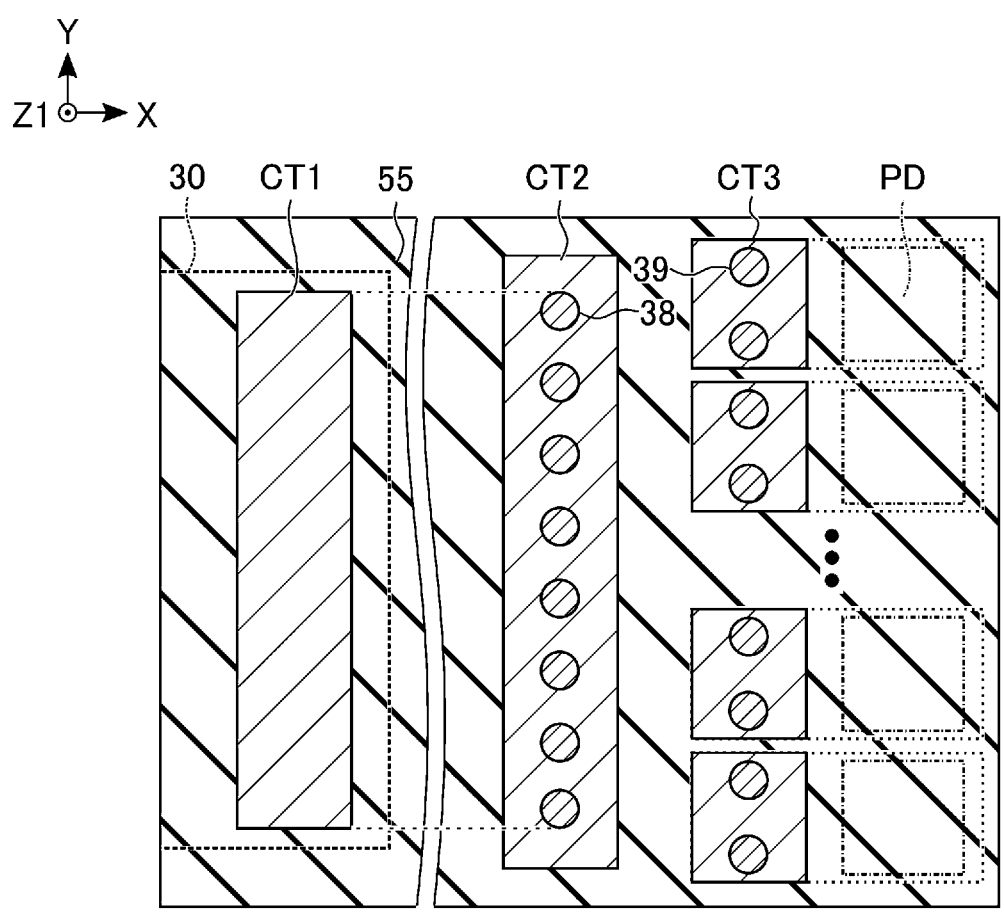
FIG. 8 is a cross-sectional view of the semiconductor storage device along a line VIII-VIII of FIG. 7.

Next, with reference to FIG. 8, a configuration of a cross section of the wiring layers 60a to 60c along the XY plane will be described. FIG. 8 is a cross-sectional view of the semiconductor storage device 1 along a line VIII-VIII of FIG. 7.

As shown in FIG. 8, in the XY plane, the portion CT1 is provided, for example, in a rectangular shape having a side parallel to the X direction and a side parallel to the Y direction and longer than the side parallel to the X direction. A length of the portion CT1 along the Y direction may be shorter than, for example, a length of the conductor layer 30 (indicated by a chain line in FIG. 8) along the Y direction.

In the XY plane, for example, a plurality of conductor layers 38 connected to different circuits among various circuits 11 to 17 may be provided adjacently along the Y direction. The plurality of conductor layers 38 are provided, for example, within a range from one end to the other end of the portion CT1 along the Y direction.

The portion CT2 may surround a plurality of conductor layers 38 in the XY plane, and is provided, for example, in a rectangular shape having a side parallel to the X direction and a side parallel to the Y direction and longer than the side parallel to the X direction.

In the XY plane, for example, a plurality of conductor layers 39 connected to different circuits among various circuits 11 to 17 are provided adjacently along the Y direction.

Further, a plurality of electrode pads PD (indicated by a dot and dash line in FIG. 8) may be provided on a first surface of the semiconductor storage device 1 adjacently along the Y direction.

In the XY plane, for example, a plurality of portions CT3 each having a side parallel to the X direction and a side that is parallel to the Y direction and electrically cut off from each other are provided adjacently along the Y direction. In the XY plane, each of the plurality of portions CT3 may surround a set including two conductor layers 39 disposed adjacently along the Y direction. Each of the plurality of portions CT3 may be provided in a certain one of a plurality of wiring layers 60b which are electrically cut off from each other, and may be connected to the corresponding electrode pad PD by a part of the corresponding wiring layer 60b (shown by a dotted line in FIG. 8). Accordingly, the two conductor layers 39 in the above-described set may be connected to a common electrode pad PD among the plurality of electrode pads PD.

In an example of FIG. 8, eight conductor layers 38 may be provided within a range from one end to the other end of the conductor layer 30 along the Y direction, but the number of the plurality of conductor layers 38 and a range in which the plurality of conductor layers 38 are provided are not limited thereto. The number of the plurality of conductor layers 38 may be equal to or smaller than seven, or equal to or larger than nine. Further, the plurality of conductor layers 38 may be provided, for example, only within a range from one end to the other end of a certain electrode pad PD among the plurality of electrode pads PD along the Y direction.

Further, in the example of FIG. 8, two conductor layers 39 may be connected to one electrode pad PD, but the number of the conductor layers 39 connected to one electrode pad PD is limited to thereto. For example, one or three or more conductor layers 39 may be provided for one electrode pad PD. In this case, each of the plurality of portions CT3 may surround one or three or more conductor layers 39 in the XY plane.

1.2 Manufacturing Method of Semiconductor Storage Device

An example of the manufacturing process of the semiconductor storage device 1 according to some embodiments will be described later with reference to FIG. 9 to FIG. 16. Each of FIG. 9 to FIG. 16 shows an example of a cross-sectional structure of the semiconductor storage device 1 in a manufacturing step of the semiconductor storage device 1 according to some embodiments. A region shown in the cross-sectional view of each of the manufacturing steps shown in FIG. 9 to FIG. 11 corresponds to a region obtained by inverting a region of the memory chip 1-2 of the semiconductor storage device 1 shown in FIG. 6 upside down. Further, a region shown in the cross-sectional view of each of the manufacturing steps shown in FIG. 12 to FIG. 16 corresponds to the region shown in FIG. 6.

Figure 9:
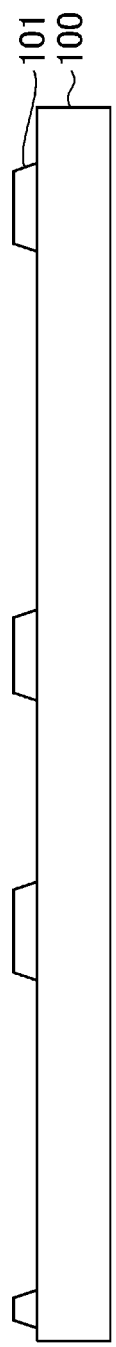
FIG. 9 is a cross-sectional view for showing a manufacturing process of the semiconductor storage device according to some embodiments.

First, as shown in FIG. 9, a sacrifice layer 101 may be formed in an island shape on a second surface of the semiconductor substrate 100. Specifically, after the sacrifice layer 101 is formed over the second surface of the semiconductor substrate 100, the sacrifice layer 101, for example, excluding predetermined regions where the portions CT1 to CT3 and DM are to be formed may be removed by processing using lithography and anisotropic etching. The sacrifice layer 101 contains, for example, silicon nitride.

Figure 10:
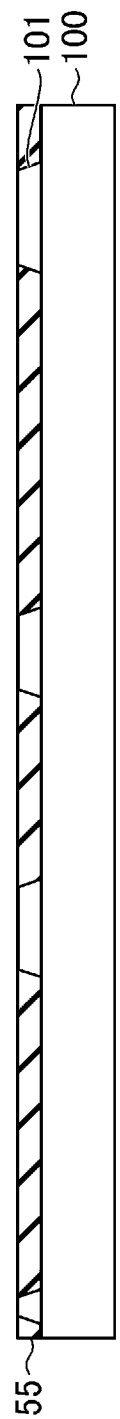
FIG. 10 is a cross-sectional view for showing a manufacturing step of the semiconductor storage device according to some embodiments.

Next, as shown in FIG. 10, the insulator layer 55 may be formed so as to bury a region on the second surface of the semiconductor substrate 100 where the sacrifice layer 101 is removed. The insulator layer 55 may be formed so as to be flat with respect to, for example, the sacrifice layer 101. Specifically, first, the insulator layer 55 may be formed on the second surfaces of the semiconductor substrate 100 and the sacrifice layer 101 so as to have a substantially uniform thickness along, for example, the Z2 direction. Then, the insulator layer 55 may be flattened by processing such as chemical mechanical polishing (CMP).

Figure 11:
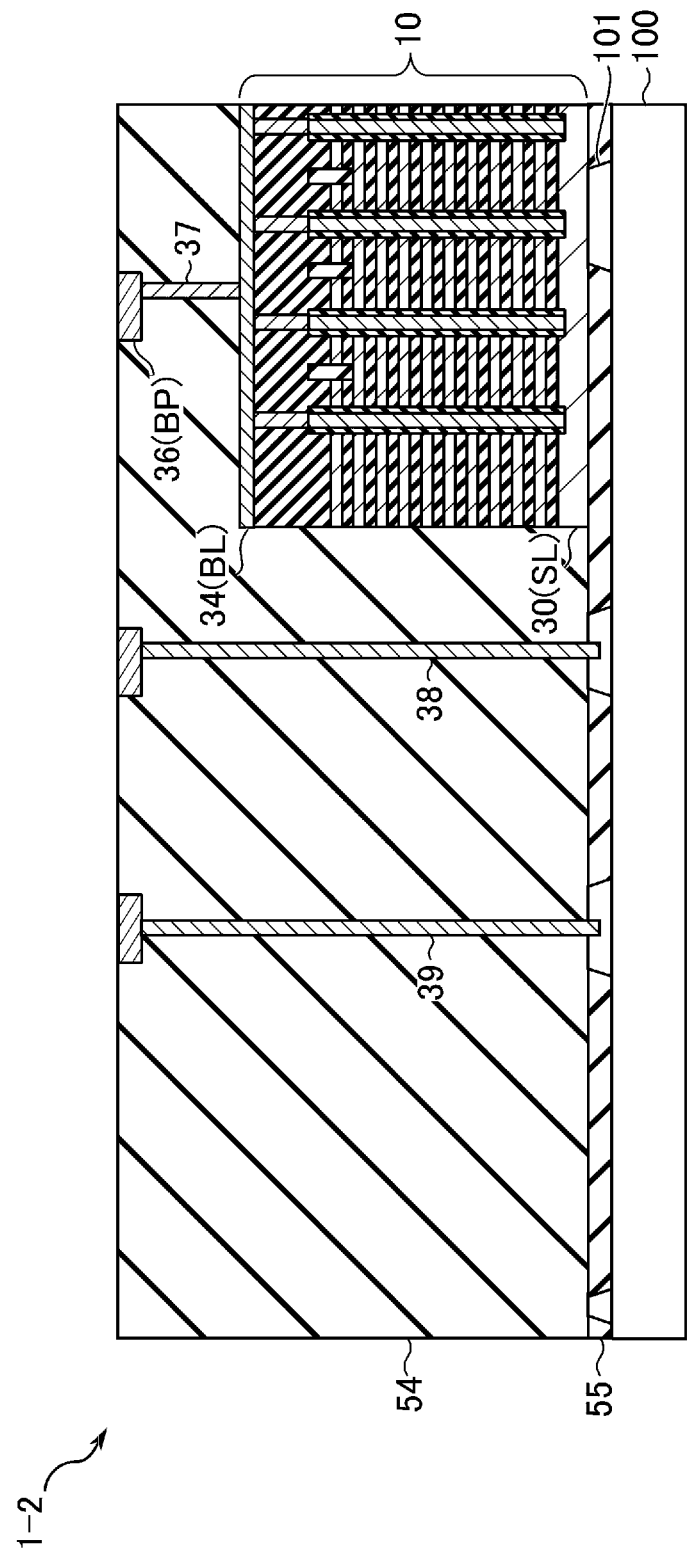
FIG. 11 is a cross-sectional view for showing a manufacturing step of the semiconductor storage device according to some embodiments.

Next, as shown in FIG. 11, the memory cell array 10 and the conductor layers 36 to 39 may be formed. Specifically, for example, the memory cell array 10 is formed, on the second surfaces of the sacrifice layer 101 and the insulator layer 55, on a region including the sacrifice layer 101 provided in the region corresponding to the portion CT1, and not including the sacrifice layer 101 provided in the regions corresponding to the portions CT2, CT3, and DM. Subsequently, the insulator layer 54 may be formed so as to cover the memory cell array 10. Holes may be formed in the insulator layer 54 in predetermined regions where the conductor layers 37 to 39 are to be formed by processing using lithography, anisotropic etching, or the like. The conductor layers 37 to 39 may be formed so as to bury the holes formed in the insulator layer 54. After the conductor layers 37 to 39 are formed, the plurality of conductor layers 36 may be formed so as to be in contact with second ends of the corresponding conductor layers 37 to 39, respectively.

In the above-described step related to FIG. 11, the conductor layer 30 in the memory cell array 10 may be formed so as to be in contact with the sacrifice layer 101 in a predetermined region where the portion CT1 is to be formed. The conductor layer 38 may be formed such that the first surface of the conductor layer 38 is in contact with the sacrifice layer 101 in a predetermined region where the portion CT2 is to be formed and is located between the first surface and a second surface of the sacrifice layer 101 (that is, the first surface of the conductor layer 38 is not in contact with the semiconductor substrate 100). The conductor layer 39 may be formed such that the first surface of the conductor layer 39 is in contact with the sacrifice layer 101 in a predetermined region where the portion CT3 is to be formed and is located between the first surface and the second surface of the sacrifice layer 101 (that is, the first surface of the conductor layer 39 is not in contact with the semiconductor substrate 100).

Figure 12:
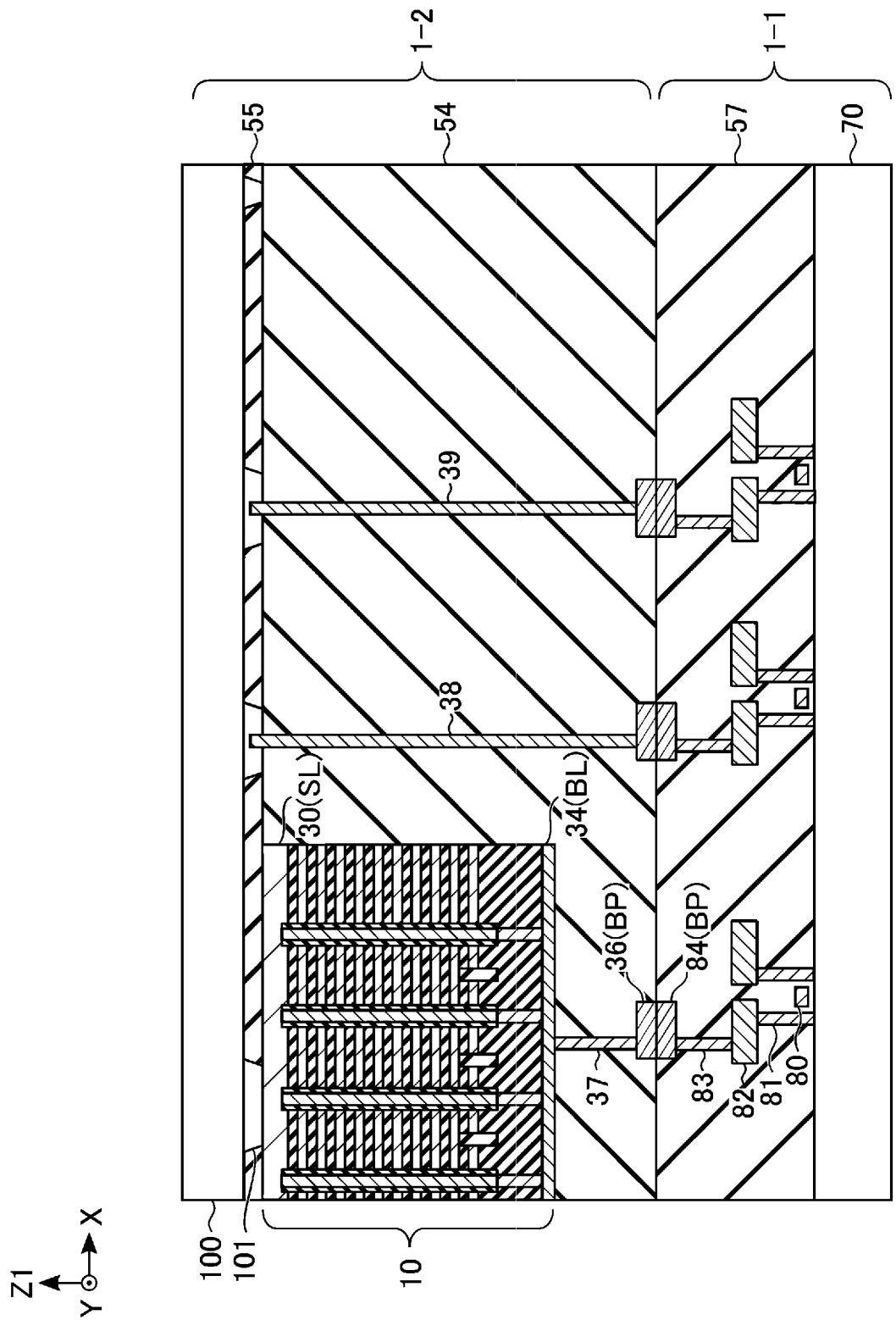
FIG. 12 is a cross-sectional view for showing a manufacturing step of the semiconductor storage device according to some embodiments.

Next, as shown in FIG. 12, the memory chip 1-2 and the circuit chip 1-1 formed by a process (not shown) may be bonded by bonding processing. Specifically, the conductor layer 36 provided in one end of the memory chip 1-2 and functioning as the connection pad BP, and the conductor layer 84 provided in one end of the circuit chip 1-1 and functioning as the connection pad BP may face each other. Then, the connection pads BP facing each other may be bonded by heat treatment. Since the circuit chip 1-1 is formed by using the semiconductor substrate 70 different from that of the memory chip 1-2, the process of forming the memory chip 1-2 and the process of forming the circuit chip 1-1 shown in FIG. 9 to FIG. 11 can be performed in parallel.

Figure 13:
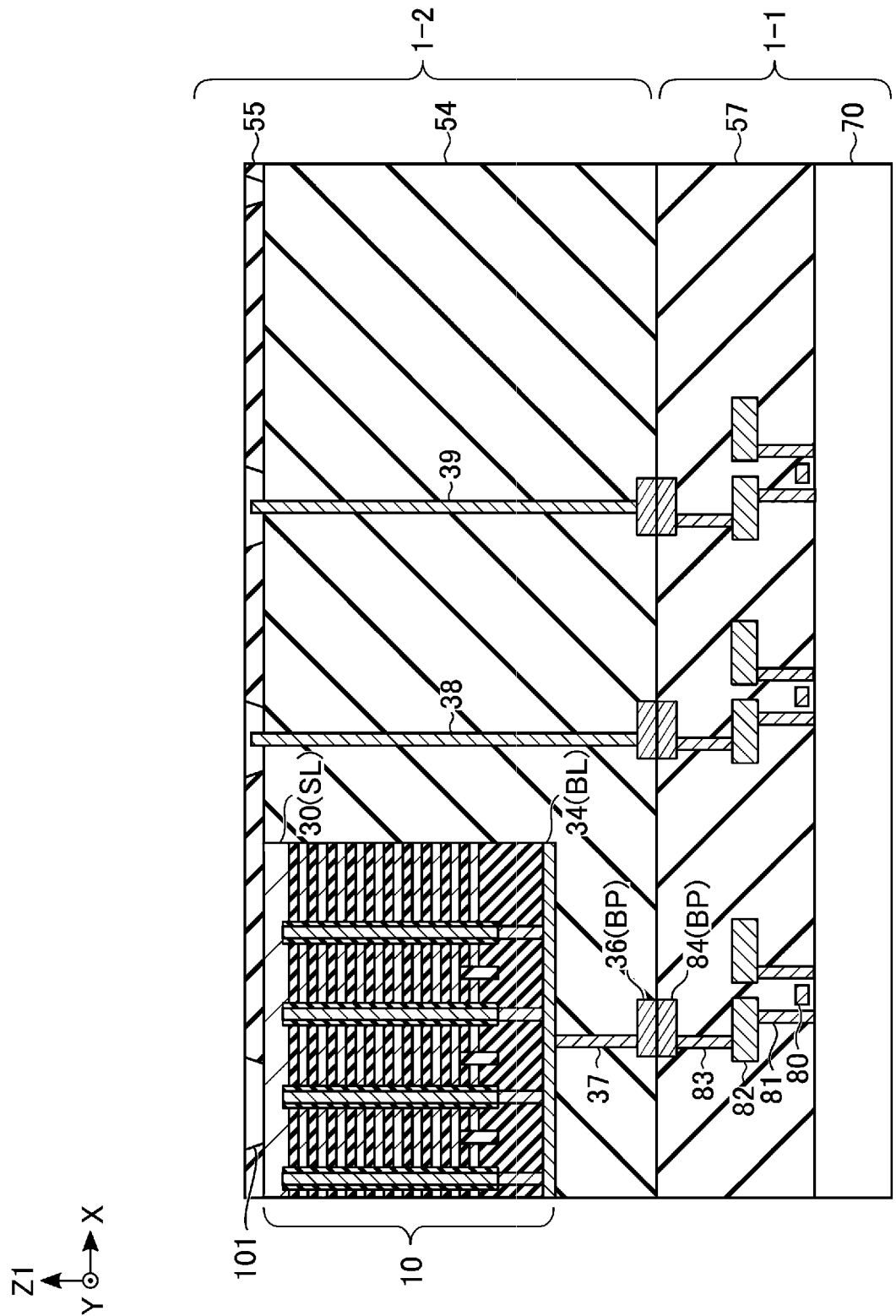
FIG. 13 is a cross-sectional view for showing a manufacturing step of the semiconductor storage device according to some embodiments.

Next, as shown in FIG. 13, the semiconductor substrate 100 may be removed by CMP or the like, and the sacrifice layer 101 may be exposed on the first surface of the semiconductor storage device 1.

Figure 14:
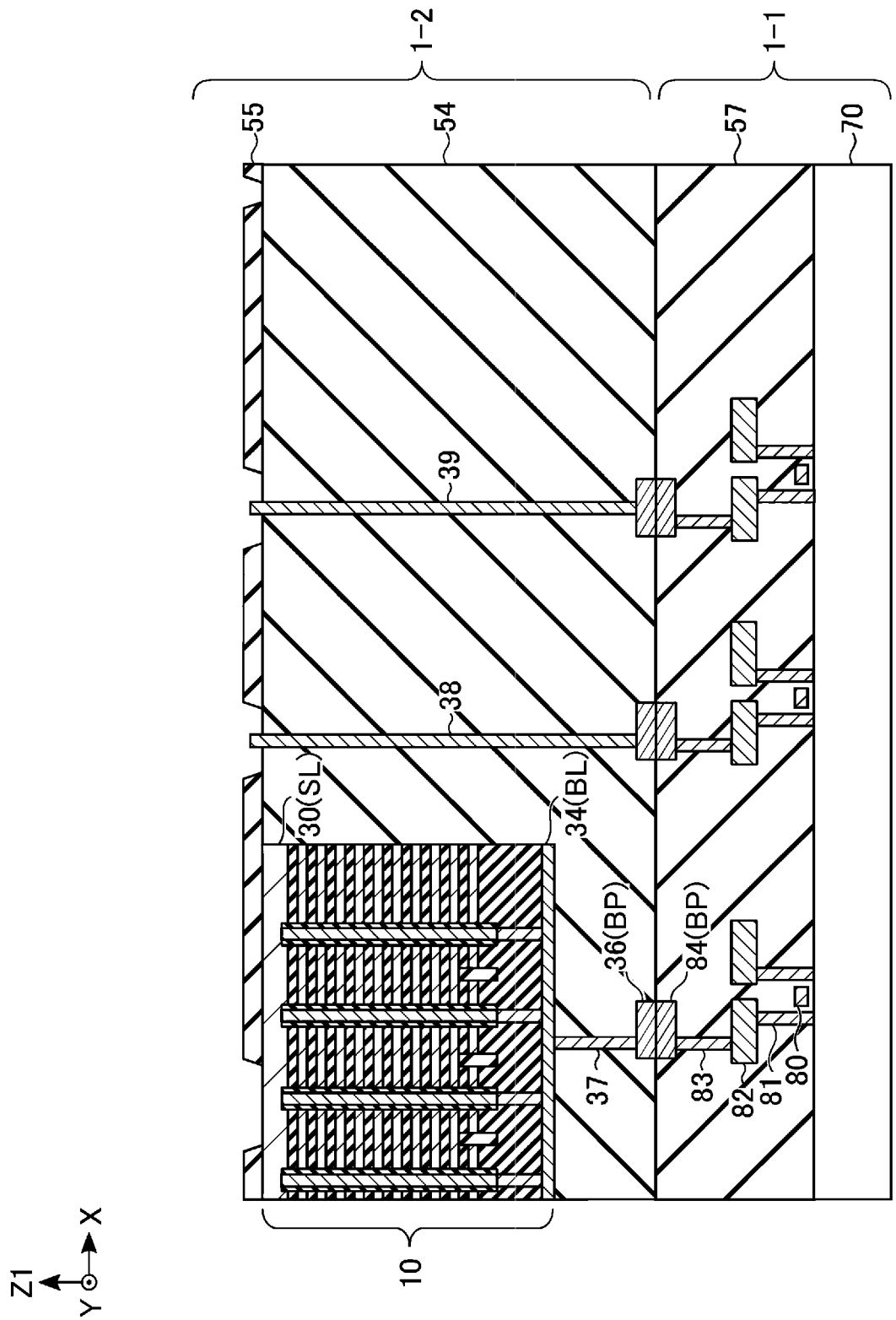
FIG. 14 is a cross-sectional view for showing a manufacturing step of the semiconductor storage device according to some embodiments.

Next, as shown in FIG. 14, the sacrifice layer 101 may be selectively removed by wet etching or dry etching. By this step, the predetermined regions where the portions CT1, CT2, CT3, and DM are to be provided may be exposed on the first surface of the semiconductor storage device 1.

Figure 15:
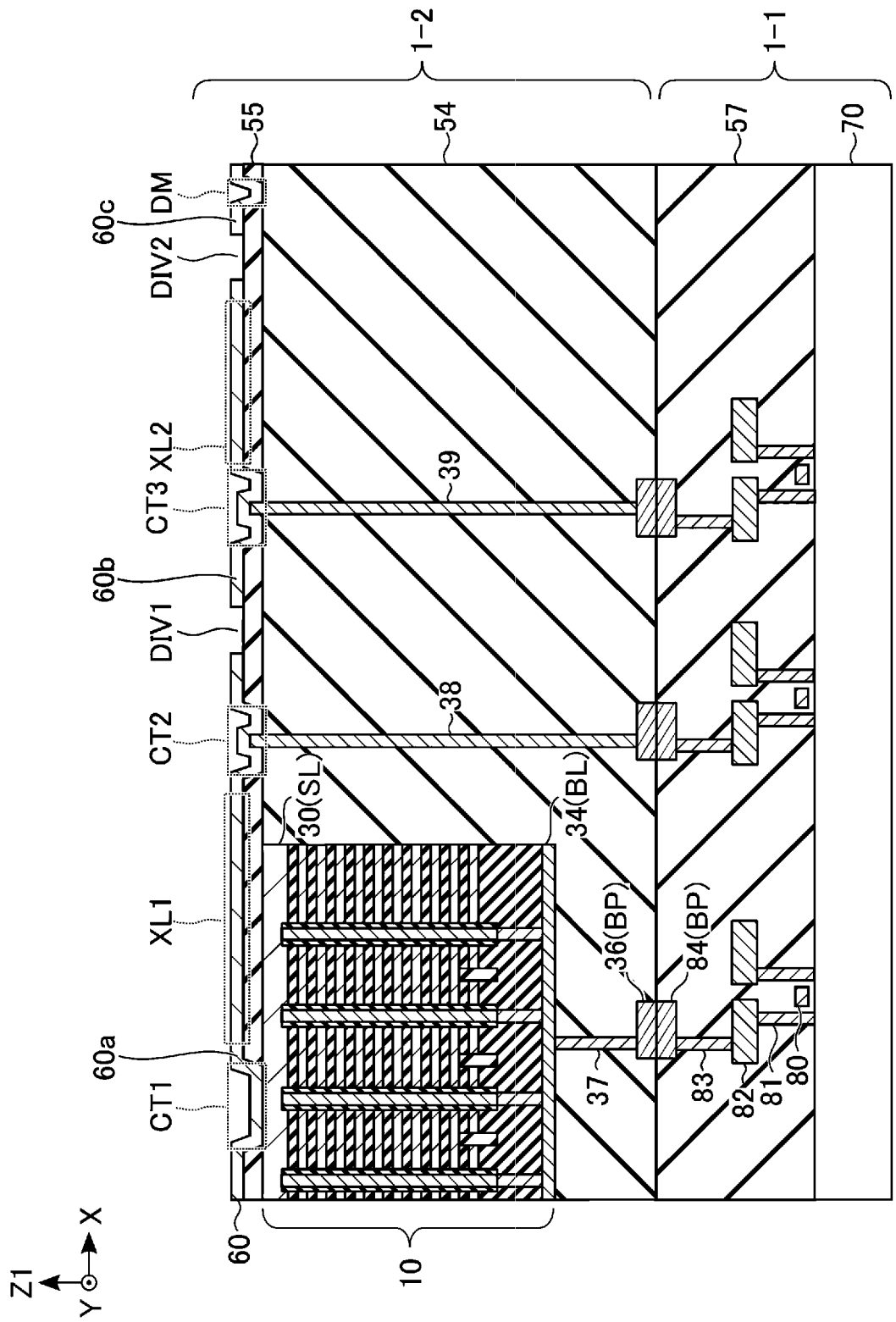
FIG. 15 is a cross-sectional view for showing a manufacturing step of the semiconductor storage device according to some embodiments.

Next, as shown in FIG. 15, the wiring layers 60a, 60b, and 60c are formed, for example, by using the predetermined region, which is exposed on the first surface of the semiconductor storage device 1 and where the portion DM is to be provided, as an alignment pattern. Specifically, on a first surface of the insulator layer 55, on portions of the first surfaces of the conductor layer 30 and the insulator layer 54 where the insulator layer 55 is not provided, and on the first surfaces of the conductor layers 38 and 39, a wiring layer may be formed such that a thickness of the wiring layer along the Z direction is substantially uniform. Then, divided portions DIV1 and DIV2 may be formed by, for example, processing or the like using lithography and etching, and the wiring layer is separated into the wiring layers 60a, 60b, and 60c. By this step, the portions CT1 to CT3 and DM may be formed.

Figure 16:
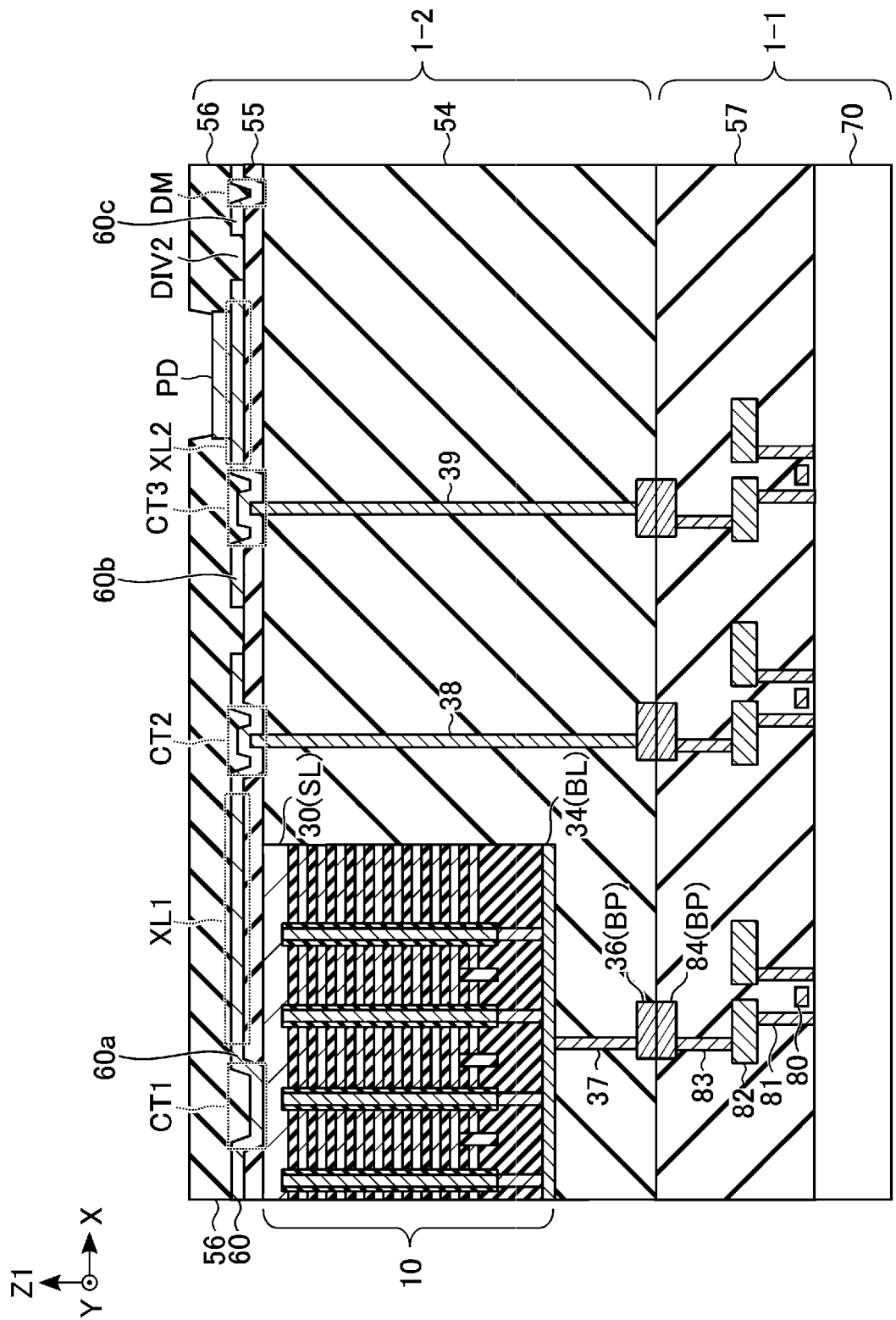
FIG. 16 is a cross-sectional view for showing a manufacturing step of the semiconductor storage device according to some embodiments.

Next, as shown in FIG. 16, the electrode pad PD and the insulator layer 56 having an opening on a first surface of the electrode pad PD may be formed. First, the electrode pad PD may be formed on the first surface of the portion XL2. Then, the insulator layer 56 may be formed on the first end of the semiconductor storage device 1 excluding the opening.

The manufacturing process described above is merely an example, and other processing may be inserted between the manufacturing steps, and the order of the manufacturing steps may be changed.

1.3 Effect

According to some embodiments, it is possible to improve characteristics of the semiconductor storage device while preventing an increase in manufacturing cost. Effects of the embodiments will be described later.

According to some embodiments, in a manufacturing process of the memory chip 1-2, the regions of the sacrifice layer 101 corresponding to the portion CT1 to CT3 and DM on the second surface of the semiconductor substrate 100 are formed to be separated from each other. The insulator layer 55 may be formed so as to bury the regions of the sacrifice layer 101 that are separated from each other, and the second surface of the insulator layer 55 may be flat with respect to the second surface of the sacrifice layer 101. After the memory chip 1-2 and the circuit chip 1-1 are bonded together, the semiconductor substrate 100 and the sacrifice layer 101 may be removed. Then, the wiring layers 60a to 60c may be formed on a first surface of the memory chip 1-2 where the sacrifice layer 101 is removed and a pattern is formed.

In the semiconductor storage device 1 manufactured by such a manufacturing method, contact surfaces between the wiring layer 60a and the conductor layer 30 as well as between the wiring layer 60a and the insulator layer 54 and contact surfaces between the wiring layers 60b and 60c and the insulator layer 54 can be located at the same height. The first surfaces of the plurality of portions 55-1 to 55-5 can be located at the same height. The second surfaces of portions of the wiring layers 60a to 60c that are provided on the first surfaces of the plurality of portions 55-1 to 55-5 can be located at the same height. The conductor layers 38 and 39 may be provided such that the first end of each of the conductor layers 38 and 39 is located between the first surface of each of the conductor layer 30 and the insulator layer 54 and the first surfaces of the portions 55-1 to 55-5.

According to the semiconductor storage device 1 manufactured by the manufacturing method as described above, it is possible to expose the predetermined regions where the portions CT1 to CT3 and DM are to be formed by the same step. Therefore, the increase in manufacturing cost can be prevented as compared with a case where after the memory chip and the circuit chip are bonded together, the predetermined regions where the portions CT1 to CT3 and DM are to be formed are formed on the first surface of the semiconductor storage device by separate steps.

Further, a predetermined region of the first surface of the conductor layer 30 that is to be connected to the portion CT1 is exposed by removing the sacrifice layer 101. Accordingly, as compared with a case where, when the portion CT1 is formed, a part of the conductor layer covered by the insulator layer is exposed by using photolithography or the like, and a connection portion between the wiring layer and the conductor layer is formed on the exposed part, damage to the conductor layer 30 and the memory pillar MP can be prevented. By preventing the damage to the conductor layer 30, an increase in resistance between the conductor layer 30 and the wiring layer 60a can be prevented. Further, by preventing damage to the memory pillar MP, the portion CT1 can be provided, for example, directly above a region where the memory pillar MP is provided in the Z1 direction. Therefore, the increase in the resistance between the conductor layer 30 and the wiring layer 60a can also be prevented. Accordingly, it is possible to easily connect the memory cell array 10 and the various circuits 11 to 17 in the semiconductor storage device 1. Therefore, characteristics of the semiconductor storage device 1 can be improved.

2. Modification

The embodiments described above may have various modifications.

Hereinafter, a semiconductor storage device according to a modification of the embodiments will be described. Hereinafter, description of configurations and manufacturing methods the same as those in the embodiments will be omitted, and configurations and manufacturing methods different from those in the embodiments will be mainly described. The same effect as those in the embodiments can also be obtained in the modification.

2.1 First Modification

In the embodiments described above, a case where the wiring layer 60a and the conductor layer 30 are connected by one portion CT1 at one place on the first surface of the conductor layer 30 was shown, but the present disclosure is not limited thereto. For example, the wiring layer 60a and the conductor layer 30 may be connected by a plurality of portions CT1 at a plurality places on the first surface of the conductor layer 30.

Figure 17:
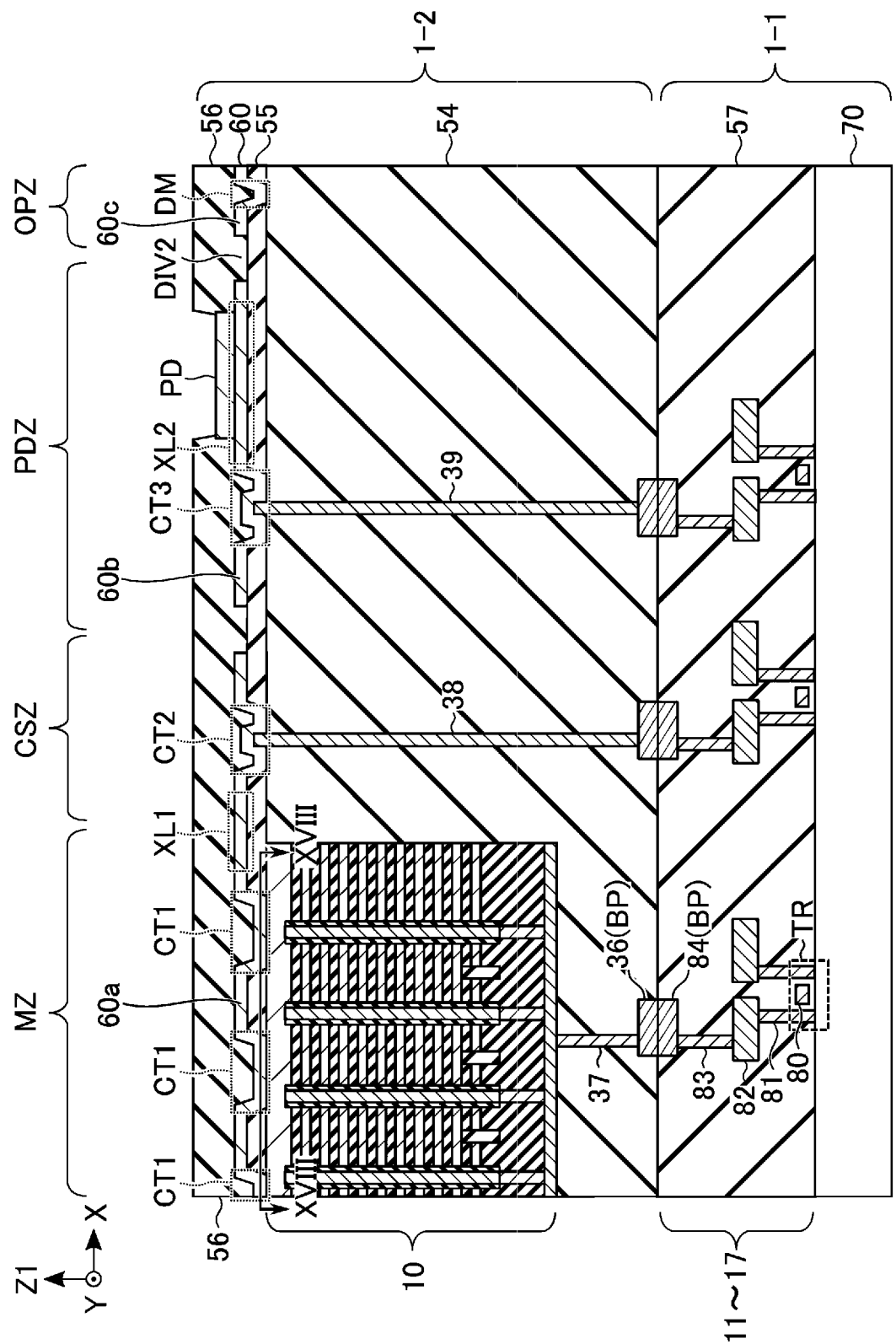
FIG. 17 is a cross-sectional view showing an example of a semiconductor storage device according to a first modification.

The semiconductor storage device 1 according to a first modification will be described with reference to FIG. 17. FIG. 17 corresponds to FIG. 6 in the embodiment.

As shown in FIG. 17, the semiconductor storage device 1 according to the first modification has, on the first surface of the conductor layer 30, a plurality of portions where the insulator layer 55 is not provided.

In the first modification, the wiring layer 60a may have a plurality of portions CT1 where the wiring layer 60a and the conductor layer 30 are connected, in a plurality of portions on the first surface of the conductor layer 30 where the insulator layer 55 is not provided. Since a shape of each of the plurality of portions CT1 in an XZ plane is to the same as that of the portion CT1 in the embodiments, the description thereof will be omitted.

Figure 18:
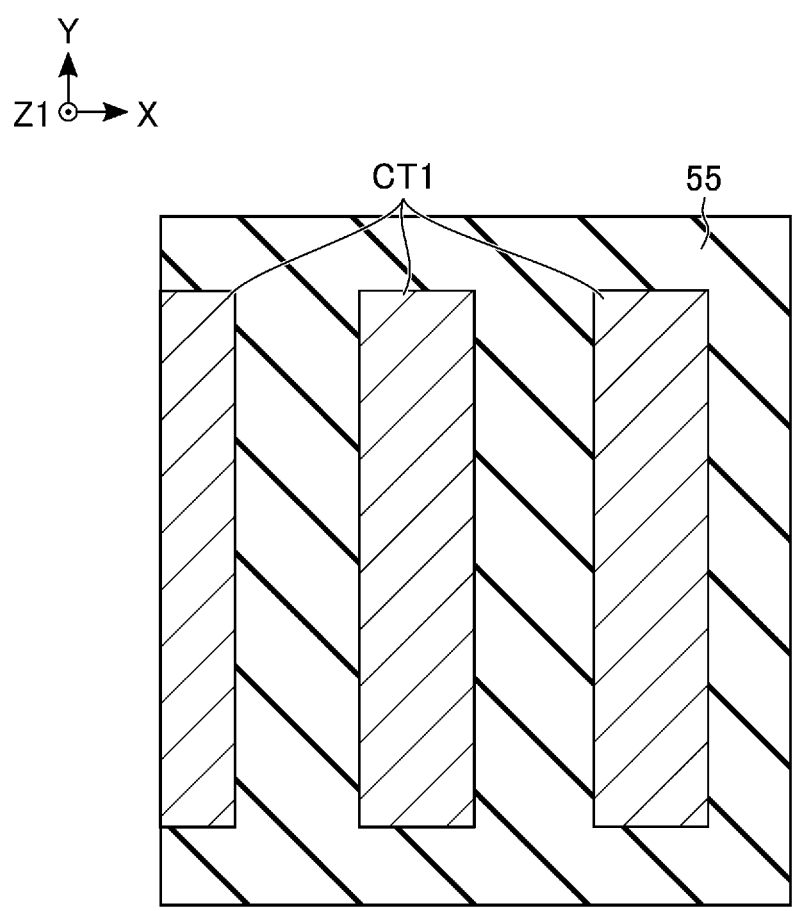
FIG. 18 is a cross-sectional view of the semiconductor storage device along a line XVIII-XVIII of FIG. 17.

Next, with reference to FIG. 18, a configuration of a cross section of the plurality of portions CT1 on the wiring layer 60a along the XY plane will be described. FIG. 18 is a cross-sectional view of the semiconductor storage device 1 along a line XVIII-XVIII of FIG. 17.

As shown in FIG. 18, in the XY plane, each of the plurality of portions CT1 may have the same shape as that of the portion CT1 in the embodiments and is disposed adjacently along the X direction. Accordingly, the wiring layer 60a may be provided such that the plurality of portions CT1, each of which extends long along the Y direction, are disposed in a striped shape in the XY plane.

In the first modification described above, an example in which three portions CT1 are provided was shown, but the present disclosure is not limited thereto. The number of the plurality of portions CT1 may be two or four or more.

According to the first modification, the wiring layer 60a and the conductor layer 30 may be connected by the plurality of portions CT1. Accordingly, it is possible to prevent a decrease in a contact area between the wiring layer 60a and the conductor layer 30, and further prevent an increase in resistance between the wiring layer 60a and the conductor layer 30. Therefore, it is possible to easily connect the memory cell array 10 and the various circuits 11 to 17 in the semiconductor storage device 1. Therefore, characteristics of the semiconductor storage device 1 can be further improved.

2.2 Second Modification

In the embodiments and the first modification described above, a case where the wiring layer 60a is directly connected to the conductor layer 30 in the portion CT1 was shown, but the present disclosure is not limited thereto. For example, a first end of the conductor layer 30 includes a portion where the conductor layer 30 is silicidized, and the wiring layer 60a and the conductor layer 30 may be connected via the silicidized portion of the conductor layer 30.

Figure 19:
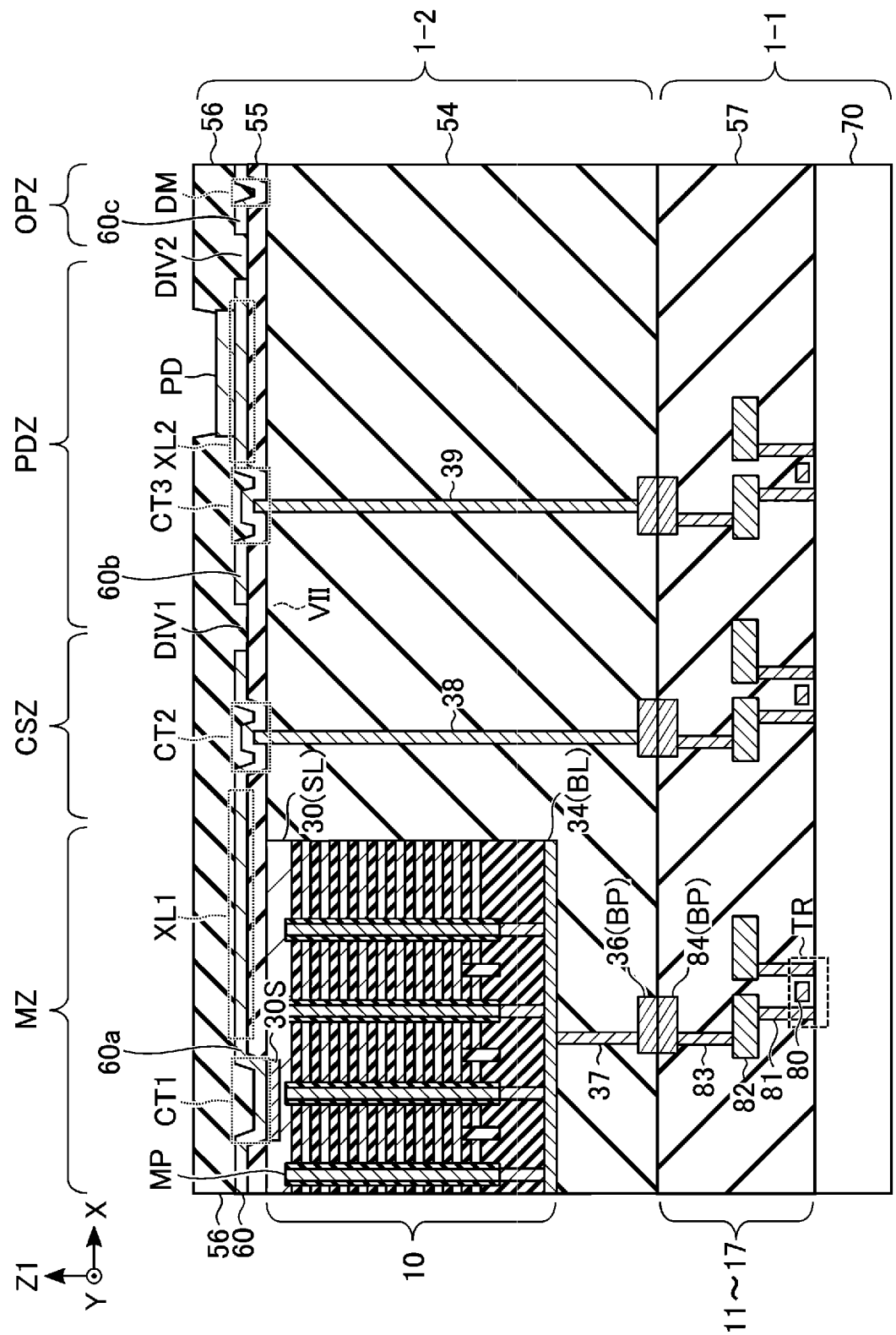
FIG. 19 is a cross-sectional view showing an example of a semiconductor storage device according to a second modification.

The semiconductor storage device 1 according to a second modification will be described with reference to FIG. 19. FIG. 19 corresponds to FIG. 6 in the embodiment.

As shown in FIG. 19, in the second modification, the conductor layer 30 includes a silicidized portion 30S in a region connected to the portion CT1 in the first end of the conductor layer 30. The silicidized portion 30S contains, for example, titanium silicide, nickel silicide, cobalt silicide, or the like.

In an example shown in FIG. 19, a case where the conductor layer 30 is connected to the wiring layer 60a by one portion CT1 was shown, but the present disclosure is not limited thereto. For example, when the wiring layer 60a includes a plurality of portions CT1, the conductor layer 30 may include the silicidized portions 30S in regions respectively connected to the plurality of portions CT1.

Next, a manufacturing method the semiconductor storage device 1 according to the second modification will be described.

In the second modification, before the step of FIG. 15 in the embodiment, a portion of the conductor layer 30 exposed on the first surface of the semiconductor storage device 1 may be silicidized by using rapid thermal annealing (RTA) treatment or the like in the step of FIG. 14 in the embodiment. Accordingly, the silicidized portion 30S may be formed in the first end of the conductor layer 30.

According to the second modification, the wiring layer 60a and the conductor layer 30 may be connected via the silicidized portion 30S in the conductor layer 30. Accordingly, an increase in resistance between the wiring layer 60a and the conductor layer 30 can be further prevented. Therefore, it is possible to further easily connect the memory cell array 10 and the various circuits 11 to 17 in the semiconductor storage device 1. Therefore, characteristics of the semiconductor storage device 1 can be further improved.

3. Others

While certain embodiments have been described, these embodiments have been presented by way of example only, and are not intended to limit the scope of the disclosure. Indeed, the novel embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a substrate;
   a first transistor provided on the substrate;
   a bit line provided above the first transistor;
   a plurality of first conductor layers stacked above the bit line along a first direction;
   a second conductor layer provided above the plurality of first conductor layers in the first direction and having a first surface and a second surface;
   a first pillar extending along the first direction in the plurality of first conductor layers and including a first semiconductor layer, the first semiconductor layer being in contact with the second conductor layer at the first surface;
   a second pillar extending along the first direction in the plurality of first conductor layers and including a second semiconductor layer, the second semiconductor layer being in contact with the second conductor layer;
   a first charge storage layer provided between the first semiconductor layer and the plurality of first conductor layers;
   a second charge storage layer provided between the second semiconductor layer and the plurality of first conductor layers;
   a first contact, extending along the first direction, above the substrate, having a first end and a second end, and electrically connected to the first transistor at the first end; and
   a first wiring layer including a first portion in contact with the second conductor layer at the second surface, a second portion in contact with the second end of the first contact, and a third portion connecting the first portion and the second portion, wherein
   the first portion and the second portion of the first wiring layer are located at a height between a height of the second conductor layer and a height of the third portion of the first wiring layer, along the first direction.

2. The semiconductor storage device according to claim 1, wherein an upper surface of the first contact is located at a height between a height of an upper surface of the second conductor layer and a height of a lower surface of the third portion of the first wiring layer, along the first direction.

3. The semiconductor storage device according to claim 1, wherein the first wiring layer further includes a fourth portion in contact with the second conductor layer.

4. The semiconductor storage device according to claim 1, further comprising:
   a second contact extending along the first direction above the substrate; and
   a second wiring layer including a first portion in contact with the second contact and a second portion connected to the first portion, the second wiring layer being separated from the first wiring layer, wherein
   the second portion of the second wiring layer is located above the first portion of the second wiring layer along the first direction.

5. The semiconductor storage device according to claim 4, wherein the first portion of the second wiring layer is located above the second conductor layer along the first direction.

6. The semiconductor storage device according to claim 5, wherein
   an upper surface of the second contact is located at a height between a height of the upper surface of the second conductor layer and a height of a lower surface of the second portion of the second wiring layer, along the first direction.

7. The semiconductor storage device according to claim 4, further comprising:
   a pad in contact with an upper surface of the second portion of the second wiring layer and connected to the first portion of the second wiring layer via the second portion of the second wiring layer.

8. The semiconductor storage device according to claim 4, further comprising:
   a third wiring layer provided at a height between the height of the third portion of the first wiring layer and the height of the second conductor layer and between a height of the second portion of the second wiring layer and the height of the second conductor layer, along the first direction, the third wiring layer being separated from the first wiring layer and the second wiring layer.

9. The semiconductor storage device according to claim 8, wherein
   the third wiring layer is provided in an outer peripheral region of the semiconductor storage device in a plane orthogonal to the first direction.

10. The semiconductor storage device according to claim 1, further comprising:
    a first insulator layer provided in contact with the second conductor layer,
    wherein a portion of an upper end of the first insulator layer is in contact with the first wiring layer.

11. The semiconductor storage device according to claim 4, wherein
    the third portion of the first wiring layer and the second portion of the second wiring layer are provided on the same plane orthogonal to the first direction.

12. The semiconductor storage device according to claim 8, wherein
    the first portion and the second portion of the first wiring layer, the first portion of the second wiring layer, and the third wiring layer are provided on the same plane orthogonal to the first direction.

13. The semiconductor storage device according to claim 4, further comprising:
    a first circuit and a second circuit provided on the substrate;
    a first metal connected to the first circuit and connected to the first contact; and
    a second metal connected to the second circuit and connected to the second contact, wherein the first metal and the second metal are located on a same plane orthogonal to the first direction.

14. The semiconductor storage device according claim 1, wherein
the second conductor layer is a source line.

15. The semiconductor storage device according to claim 10, further comprising:
a second insulator layer provided in contact with the first wiring layer, the second wiring layer, and the third wiring layer.

16. The semiconductor storage device according to claim 15, wherein contact surfaces between the first wiring layer and the second conductor layer have the same height as a height of contact surfaces between the first wiring layer and the second insulator layer.

17. The semiconductor storage device according to claim 15, wherein contact surfaces between the first wiring layer and the second conductor layer have the same height as a height of contact surfaces between the second and third wiring layers and the second insulator layer.

* * * * *